US012796251B2

(12) United States Patent
Jin et al.

(10) Patent No.: US 12,796,251 B2

(45) Date of Patent: Nov. 10, 2026

(54) DISPLAY DEVICE

(71) Applicant: Samsung Display Co., Ltd., Yongin-Si (KR)

(72) Inventors: Guanghai Jin, Yongin-si (KR); Yong Seog Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/508,233

(22) Filed: Nov. 14, 2023

(65) Prior Publication Data

US 2024/0284731 A1 Aug. 22, 2024

(30) Foreign Application Priority Data

Feb. 22, 2023 (KR) ........................ 10-2023-0023665

(51) Int. Cl.

*H10K 59/131* (2023.01)
*G06F 1/16* (2006.01)
*H10K 77/10* (2023.01)
*H10K 102/00* (2023.01)

(52) U.S. Cl.

CPC ......... *H10K 59/131* (2023.02); *G06F 1/1652* (2013.01); *H10K 77/111* (2023.02); *H10K 2102/311* (2023.02)

(58) Field of Classification Search

CPC .. H10K 59/131; H10K 59/123; H10K 59/124; H10K 59/40; H10K 59/805; H10K 77/111; G06F 1/1652

See application file for complete search history.

(56) References Cited

U.S. PATENT DOCUMENTS 7,528,544 B2 * 5/2009 Kwak .................. H10K 59/131 313/506
8,354,672 B2 * 1/2013 Kwon ..................... H01L 27/12 257/E23.179
11,520,425 B2 12/2022 Kim et al.
(Continued)

FOREIGN PATENT DOCUMENTS

CN 108594548 A 9/2018
CN 111128965 A * 5/2020 ........... H01L 23/544
(Continued)

OTHER PUBLICATIONS

Zhao translation (Year: 2020).*

*Primary Examiner* — Minsun O Harvey
*Assistant Examiner* — Alexander Ehrlich
(74) *Attorney, Agent, or Firm* — Innovation Counsel LLP

(57) ABSTRACT

The present disclosure relates to a display device. According to an embodiment of the disclosure, a display device comprising gate lines, data lines, and power lines electrically connected to sub-pixels formed in a display area of a display panel, fan-out lines formed in a non-display area of the display panel and electrically connected to the data lines, gate control lines electrically connected to a gate drive unit formed in the non-display area, and line number identification patterns formed and disposed in a floating state in a line arrangement area in which one or more lines of the gate lines, the data lines, the fan-out lines, the gate control lines, and the power lines are formed, wherein the line number identification patterns overlap the one or more lines or are disposed on one side surface of the one or more lines in the line arrangement areas.

18 Claims, 14 Drawing Sheets

(56) References Cited

U.S. PATENT DOCUMENTS

| | | | |
|---|---|---|---|
| 2011/0089423 | A1 | 4/2011 | Kwon |
| 2018/0107037 | A1 | 4/2018 | Lee |
| 2024/0122051 | A1 | 4/2024 | Jin et al. |

FOREIGN PATENT DOCUMENTS

| | | | | |
|---|---|---|---|---|
| EP | 3916710 | A1 * | 12/2021 | ....... G02F 1/136286 |
| JP | 2001-168478 | A | 6/2001 | |
| KR | 10-2011-0041252 | A | 4/2011 | |
| KR | 10-2020-0081918 | A | 7/2020 | |
| KR | 10-2024-0049722 | A | 4/2024 | |

* cited by examiner

DISPLAY DEVICE

CROSS-REFERENCE TO RELATED APPLICATION

This application claims priority from Korean Patent Application No. 10-2023-0023665 filed on Feb. 22, 2023 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a display device.

2. Description of the Related Art

The importance of a display device is increasing with the development of multimedia. Accordingly, various types of display devices such as an organic light emitting display (OLED) and a liquid crystal display (LCD) are being used.

Display devices are devices for displaying images, and a modern display device typically includes a display panel such as a light emitting display panel or a liquid crystal display panel. A light emitting display panel generally includes light emitting elements, each of which may be a light emitting diode (LED) such as an organic light emitting diode (OLED) or an inorganic light emitting diode. An OLED uses an organic material as an electroluminescent material, and an inorganic light emitting diode uses an inorganic material as an electroluminescent material.

Such a display device or display panel may include a display area and a non-display area. The display area typically contains an array of pixels displaying images, and the non-display area is typically around the display area. In the non-display area, various lines such as a gate line and a data line for driving the pixels may be integrated. In order to better identify defects that may occur during a manufacturing process and to facilitate a repair process, each line, such as the gate and data lines, may be assigned line numbers that identify and distinguish the lines.

SUMMARY

Aspects of the present disclosure allow identification of lines in a display device using line number identification patterns formed in a non-display area of a display panel of the display device.

Aspects of the present disclosure also provide a display device and a process for manufacturing a display device capable of forming line number identification patterns and various lines in a non-display area so that an influence of parasitic capacitance due to formation of the line number identification patterns becomes zero or is minimized.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an embodiment of the disclosure, a display device includes gate lines, data lines, and power lines electrically connected to sub-pixels in a display area of a display panel. Fan-out lines in a non-display area of the display panel electrically connect to the data lines, and gate control lines electrically connect to a gate drive unit in the non-display area. The display device further includes line number identification patterns in a line arrangement area through which one or more lines of the gate lines, the data lines, the fan-out lines, the gate control lines, and the power lines extend, the line number patterns being in a floating state. The line number identification patterns overlap the one or more lines or are adjacent to the one or more lines in the line arrangement area.

In an embodiment of the display device, the line number identification patterns are disposed side by side at a preset interval in the line arrangement area, first lines of the one or more lines are in an area between the line number identification patterns so as not to overlap the number identification patterns, and second lines of the one or more lines overlap at least one line number identification pattern with at least one insulating layer interposed therebetween.

In an embodiment of the display device of claim 2, the line number identification patterns and the first lines contain the same material and are portions of a first patterned layer in the display panel, the line number identification patterns are adjacent to the first lines or in areas between the first lines and are not electrically connected to the first lines, and the second lines are portions of a second patterned layer of the display panel and overlap the line number identification patterns with the at least one insulating layer interposed between the second lines and the line number identification patterns.

In an embodiment of the display device, at least one of a size of the line number identification patterns and a formation width of the line number identification patterns is smaller than a sum of a distance between two lines adjacent to each other among the one or more lines and widths of the two lines.

In an embodiment of the display device, the one or more lines includes odd-numbered lines and even-numbered lines. The first lines are the odd-numbered lines and are formed in the line arrangement area with the same material as the line number identification patterns and through the same patterning process. The line number identification patterns are respectively adjacent to the odd-numbered lines, and the second lines are the even-numbered lines and respectively overlap the line number identification patterns with at least one insulating layer interposed therebetween.

In an embodiment of the display device, the odd-numbered lines and the even-numbered lines are connected through respective contact holes to the data lines or the power lines in a one-to-one manner.

In an embodiment of the display device of claim 2, the first lines and the line number identification patterns are formed of the same material as a gate electrode of a thin film transistor through the same patterning process that forms the gate electrode or are formed of the same material as source and drain electrodes of the thin film transistor through the same patterning process that forms the source and drain electrodes. The second lines may be simultaneously formed of the same material of an electrode selected from a group consisting of the source and drain electrodes, and a capacitor electrode, a first anode connection electrode, a second anode connection electrode, a pixel electrode, a common electrode, and any one of touch electrodes of a touch sensing unit through the same patterning process unlike the first lines.

In an embodiment, a display device includes gate lines, data lines, and power lines electrically connected to sub-pixels formed in a display area of a display panel. Fan-out lines are in a non-display area of the display panel and electrically connected to the data lines. Gate control lines electrically connected to a gate drive unit formed in the non-display area. First lines and second lines are in a line arrangement area, the first lines and the second lines being selected from a group consisting of the gate lines, the data lines, the power lines, the fan-out lines, and the gate control lines. The display device further includes line number identification patterns that are in the line arrangement area and in a floating state electrically separated from the first lines and the second lines.

In an embodiment of the display device, the line number identification patterns are respectively adjacent to the first lines and positioned so as not to be electrically connected to the first lines, or the line number identification patterns are each disposed in an area between lines disposed to be adjacent to each other among the one or more lines.

In an embodiment of the display device, the first lines are formed simultaneously with the line number identification patterns through the same patterning process that forms the line number identification patterns, and the second lines are formed and disposed on a different layer from the first lines and the line number identification patterns with at least one insulating layer interposed therebetween.

In an embodiment of this display device, the first lines are odd-numbered lines, and the second lines are even-numbered lines.

In an embodiment of this display device, each of the first lines has a straight-line shape in the line arrangement area. At least one of the line number identification patterns is in an area between the first lines that are adjacent to each other among the first lines, and the second lines are disposed on a different layer from the line number identification patters with the at least one insulating layer interposed therebetween, and each of the second lines is bent at least once so as not to overlap the line number identification patterns, the second lines having a longer length than the first lines.

In an embodiment of the display device, each of the second lines include at least one bent portion bent in a shape surrounding at least one side of the line number identification patterns, and the second lines and the line number identification patterns are disposed on different layers with the at least one insulating layer interposed therebetween. The at least one bent portion is formed in at least one of a "C" shape, an inverted "C" shape, an "S" shape, an inverted "S" shape, a "⊏" shape, an inverted "⊏" shape, a "ㄹ" shape, and an inverted "ㄹ" shape, or a combination thereof in plan view.

In an embodiment of the display device, at least one of the line number identification patterns is formed and disposed in an area between a pair of the first and second lines that are adjacent to each other. The first lines are bent at least once so as not to be electrically connected to the line number identification patterns disposed on the same layer, and the second lines are bent at least once so as not to overlap the line number identification pattern on a different layer from the line number identification patterns.

In an embodiment of this display device, the first lines include at least one first bent portion bent in a shape surrounding at least one side surface of the line number identification patterns disposed on the same layer. The second lines include at least one second bent portion bent in a shape surrounding at least one side surface of the line number identification patterns formed and disposed on the different layer with the at least one insulating layer interposed therebetween, and the at least one first and second bent portions are formed in at least one of a "C" shape, an inverted "C" shape, an "S" shape, an inverted "S" shape, a "⊏" shape, an inverted "⊏" shape, a "ㄹ" shape, and an inverted "ㄹ" shape, or a combination thereof in plan view.

In an embodiment of the display device, at least one line of the first lines and the second lines is connected to a corresponding one of the data lines or the power lines in a one-to-one manner through at least one contact hole.

In an embodiment of the display device, the first lines and the line number identification patterns are formed of the same material as a portion of a thin film transistor and formed through the same patterning process that forms the portion of the thing film transistor in the display panel, the portion of the thin film transistor being one of a gate electrode and the source and drain electrodes of the thin film transistor. The second lines are simultaneously formed of the same material and through the same process as one of a capacitor electrode, a first anode connection electrode, a second anode connection electrode, a pixel electrode, a common electrode, and any one of touch electrodes of a touch sensing unit of the display device.

According to the display device and the method for manufacturing the same according to an embodiment, the line number identification patterns may be formed on a high-resolution display panel by maintaining or further narrowing a gap between the lines, such as the gate and data line and the fan-out line, without increasing the gap.

Further, the line number may be more easily identified, and the influence of parasitic capacitance due to the formation of the line number identification patterns may become zero or be minimized.

However, the effects of the embodiments are not restricted to the one set forth herein. The above and other effects of the embodiments will become more apparent to one of daily skill in the art to which the embodiments pertain by referencing the claims.

BRIEF DESCRIPTION OF THE DRAWINGS

The above and other aspects and features of the present disclosure will become more apparent by describing in detail embodiments thereof with reference to the attached drawings.

DETAILED DESCRIPTION OF THE EMBODIMENTS

The present disclosure will now be described more fully with reference to the accompanying drawings, in which some embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

When a layer is referred to herein as being “on” another layer or substrate, the layer can be directly on the other layer or substrate, or intervening layers may also be present. The same reference numbers used in different drawings indicate the same or similar components.

Although the terms “first,” “second,” etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Features of the various embodiments of the present disclosure may be intermixed or combined with each other, in part or in whole. Each embodiment may be implemented independently of other embodiments, or two or more embodiments may be implemented together in an association.

Hereinafter, specific embodiments will be described with reference to the accompanying drawings.

Figure 1:
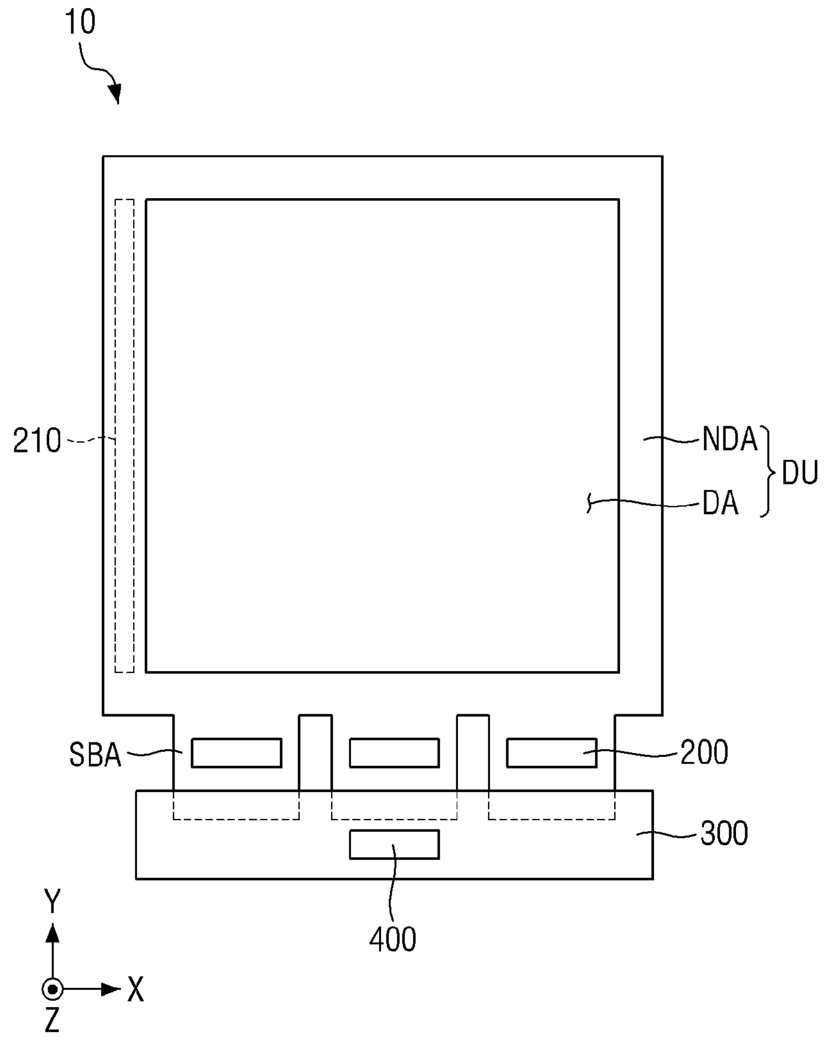
FIG. 1 is a plan view illustrating a configuration of a display device according to an embodiment of the present disclosure.
Figure 2:
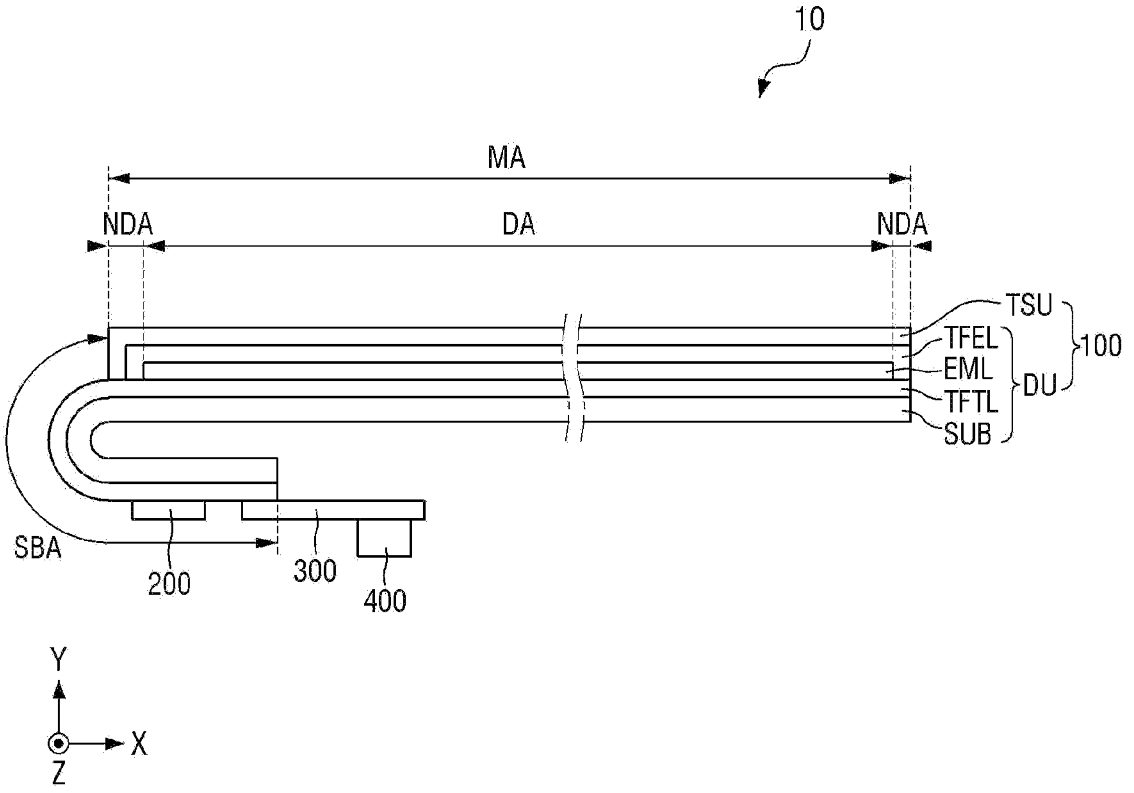
FIG. 2 is a side cross-sectional view of the display device of FIG. 1.

FIG. 1 is a plan view illustrating a display device according to an embodiment of the present disclosure. FIG. 2 is a side cross-sectional view illustrating the display device of FIG. 1.

Referring to FIGS. 1 and 2, a display device 10 according to an embodiment may be variously classified according to a display method or technology. For example, the display device 10 may be classified as or include an organic light emitting diode display (OLED), an inorganic light emitting display (inorganic EL), a quantum dot light emitting display (QED), a micro LED display (micro-LED), a nano LED display (nano-LED), a plasma display panel (PDP), a field emission display (FED), a liquid crystal display (LCD), an electrophoretic display (EPD), and the like. Hereinafter, an organic light emitting diode display (OLED) will be described as an example of the display device 10, and unless a special distinction is required, the organic light emitting diode display (OLED) applied to the embodiment may be referred to as the display device 10. Display device 10 according to the illustrated embodiment is not limited to the organic light emitting diode display (OLED), and other display devices listed above or known in the art may be applied within the scope of the present disclosure.

The display device 10 according to an embodiment may be applied to or used in a portable electronic device such as a mobile phone, a smart phone, a tablet personal computer (PC), a mobile communication terminal, an electronic notebook, an electronic book, a portable multimedia player (PMP), a navigation system, and an ultra-mobile PC (UMPC). Display device 10 may alternatively be applied as a display unit of a television, a laptop computer, a monitor, a billboard, or a component of the Internet of Things (IOT). As another example, the display device 10 may also be applied to wearable devices such as a smart watch, a watch phone, a glasses-type display, and a head mounted display (HMD). Meanwhile, the display device 10 according to an embodiment may be applied to or used as a center information display (CID) disposed on an instrument panel of a vehicle, a center fascia of a vehicle, and a dashboard of a vehicle, and may also be applied as a rear-view or room mirror display device.

Display device 10 according to an embodiment may have any desired shape such as a rectangular shape, a square shape, a circular shape, or an elliptical shape in plain view. For example, when display device 10 is applied to a wearable device, a vehicle, and the like, the display device 10 may have a rectangular shape with long sides extending along a horizontal direction. However, the present disclosure is not limited thereto, and the display device 10 may also be formed in a rectangular shape of which long sides extending in a vertical direction, or may be rotatably installed, such that the long sides of the display device 10 may also be variably positioned in the horizontal or vertical direction.

As illustrated in FIGS. 1 and 2, display device 10 may also include a touch sensing module. The touch sensing module in the display device 10 includes a touch sensing unit TSU disposed on a front surface of the display panel 100 and a touch driving circuit 400 that generates touch position coordinate data from input that the touch sensing unit TSU provides.

As an example, the display panel 100 of the display device 10 includes a display unit DU for displaying an image, and the touch sensing unit TSU for sensing a touch on the display panel 100 of a body portion such as a finger or of a touch input device such as an electronic pen. The display unit DU of display panel 100 may include a plurality of pixels and display an image through operation of the pixels. Here, each of the pixels may include red, green, and blue sub-pixels, or may include red, green, blue, and white sub-pixels.

The touch sensing unit TSU may be mounted on the front surface of the display panel 100 or formed integrally with the display panel 100. The touch sensing unit TSU may include a plurality of touch electrodes to sense a user’s touch in a capacitive manner using the touch electrodes. Detailed components and structural features of the touch sensing unit TSU are described in more detail below with reference to the accompanying drawings.

The display driving circuit 200 may output signals and voltages for driving the pixels of the display unit DU, that is, for driving the respective sub-pixels. The display driving circuit 200 may supply data voltages to data lines to which the sub-pixels are connected. The display driving circuit 200 may supply a power voltage to a power line and may supply gate control signals to a gate driving unit 210. Meanwhile, the display driving circuit 200 may also be divided into a display driving unit performing a timing control function and a data driving unit supplying the data voltages to the data lines. In this case, the display driving unit of the display driving circuit 200 may control a drive timing of the gate driving unit 210 by supplying the timing control signal to the gate driving unit 210 and the data driving unit.

The display driving circuit 200 may be formed as an integrated circuit (IC) and mounted on the display panel 100 by a chip on glass (COG) method, a chip on plastic (COP) method, or an ultrasonic bonding method. For example, the display driving circuit 200 may be disposed in a sub-area SBA of the display panel 100 and may overlap a main area MA of the display panel 100 in a thickness direction (Z-axis direction) as a result of bending of the sub-area SBA. As another example, the display driving circuit 200 may be mounted on a circuit board 300.

The touch driving circuit 400 may be electrically connected to the touch sensing unit TSU. The touch driving circuit 400 may supply touch driving signals to the touch electrodes arranged in a matrix structure in the touch sensing unit TSU and may sense an amount of change in capacitance between the touch electrodes. The touch driving circuit 400 may check a user's touch input based on the amount of change in capacitance between the touch electrodes and calculate touch coordinate data.

The display driving circuit 200 may operate as a main processor or may be formed integrally with the main processor. Accordingly, the display driving circuit 200 may control the overall function of the display device 10. For example, the display driving circuit 200 may receive touch data from the touch driving circuit 400, determine user's touch coordinates, and then generate digital video data according to the touch coordinates. In addition, the display driving circuit 200 may execute an application represented by an icon displayed on the user's touch coordinates. As still another example, the display driving circuit 200 may receive coordinate data from an electronic pen or the like, determine touch coordinates of the electronic pen, and then generate digital video data according to the touch coordinates, or also execute an application represented by an icon displayed on the touch coordinates of the electronic pen.

Referring to FIG. 2, the display panel 100 may be divided into the main area MA and the sub-area SBA. The main area MA may include a display area DA in which sub-pixels displaying an image are arranged, and a non-display area NDA disposed around the display area DA. In the display area DA, light may be emitted from a light emitting area or an opening area of each sub-pixel to display an image. To this end, the sub-pixels of the display area DA may include a pixel circuit including switching elements, a pixel defining layer defining the light emitting area or the opening area, and a light emitting element.

The non-display area NDA may be a peripheral area of the display area DA, that is, an outer area. The non-display area NDA may be defined as an edge area of the main area MA of the display panel 100. The non-display area NDA may include the gate driving unit 210 supplying gate signals to the gate lines, and fan-out lines (not illustrated) connecting the display driving circuit 200 and the data lines of the display area DA.

The sub-area SBA may extend from one side of the main area MA. The sub-area SBA may include a flexible material that may be bent, folded, rolled, or the like. For example, when the sub-area SBA is bent, the sub-area SBA may overlap the main area MA in the thickness direction (Z-axis direction). The sub-area SBA may include the display driving circuit 200 and a pad portion connected to the circuit board 300. Optionally, the sub-area SBA may be omitted, and the display driving circuit 200 and the pad portion may be disposed in the non-display area NDA.

The circuit board 300 may be attached onto the pad portion of the display panel 100 using an anisotropic conductive film (ACF). Lead lines of the circuit board 300 may be electrically connected to the pad portion of the display panel 100. The circuit board 300 may be a flexible film such as a flexible printed circuit board, a printed circuit board, or a chip on film.

Meanwhile, a substrate SUB of the display panel 100 illustrated in FIG. 2 may be a base substrate or a base member. The substrate SUB may be a flat type. Unlike this, the substrate SUB may be a flexible substrate that may be bent, folded, rolled, or the like. For example, the substrate SUB may include a glass material or a metal material but is not limited thereto. As another example, the substrate SUB may include a polymer resin such as polyimide (PI).

A thin film transistor layer TFTL may be disposed on the substrate SUB. The thin film transistor layer TFTL may include a plurality of thin film transistors constituting a pixel circuit of each of the sub-pixels. The thin film transistor layer TFTL may further include gate lines, data lines, power lines, gate control lines, fan-out lines connected to the display driving circuit 200, and lead lines connecting the display driving circuit 200 and the pad portion. When the gate driving unit 210 is formed on one side of the non-display area NDA of the display panel 100, the gate driving unit 210 may also include thin film transistors.

The thin film transistor layer TFTL may be disposed in the display area DA, the non-display area NDA, and the sub-area SBA. The thin film transistors, the gate lines, the data lines, and the power lines of each of the pixels of the thin film transistor layer TFTL may be disposed in the display area DA. The gate control lines and the fan-out lines of the thin film transistor layer TFTL may be disposed in the non-display area NDA. The lead lines of the thin film transistor layer TFTL may be disposed in the sub-area SBA.

A light emitting element layer EML may be disposed on the thin film transistor layer TFTL. The light emitting element layer EML may include a plurality of light emitting elements in which a first electrode, a light emitting layer, and a second electrode are sequentially stacked to emit light, and a pixel defining layer in the light emitting element layer EML may define each of the sub-pixels. The light emitting elements of the light emitting element layer EML may be disposed in the display area DA.

An encapsulation layer TFEL may cover an upper surface and side surfaces of the light emitting element layer EML and may protect the light emitting element layer EML. The encapsulation layer TFEL may include at least one inorganic layer and at least one organic layer for encapsulating the light emitting element layer EML.

The touch sensing unit TSU may be disposed on the encapsulation layer TFEL of the display panel 100. The touch sensing unit TSU may include a plurality of touch electrodes for sensing a user's touch in a capacitance manner, and touch lines connecting the plurality of touch electrodes to the touch driving circuit 400. The first touch electrodes of the touch sensing unit TSU may be arranged in a matrix structure to sense the user's touch in a self-capacitance method or a mutual capacitance method.

The touch sensing unit TSU may be formed integrally with the display panel 100 or may be disposed on a separate substrate or film disposed on the display unit DU of the display panel 100. In some cases, the substrate or the film supporting the touch sensing unit TSU may be a base member that encapsulates the display unit DU.

The plurality of touch electrodes included in the touch sensing unit TSU may be disposed in a touch sensor area overlapping the display area DA. The touch lines of the touch sensing unit TSU may be disposed in a touch peripheral area overlapping the non-display area NDA.

The touch driving circuit 400 may be disposed on a separate circuit board 300. The touch driving circuit 400 may be formed as an integrated circuit (IC). The touch driving circuit 400 supplies touch driving signals to the first touch electrodes of the touch sensing unit TSU and measures an amount of change in mutual capacitance of each of a plurality of first touch nodes formed by the touch electrodes.

Figure 3:
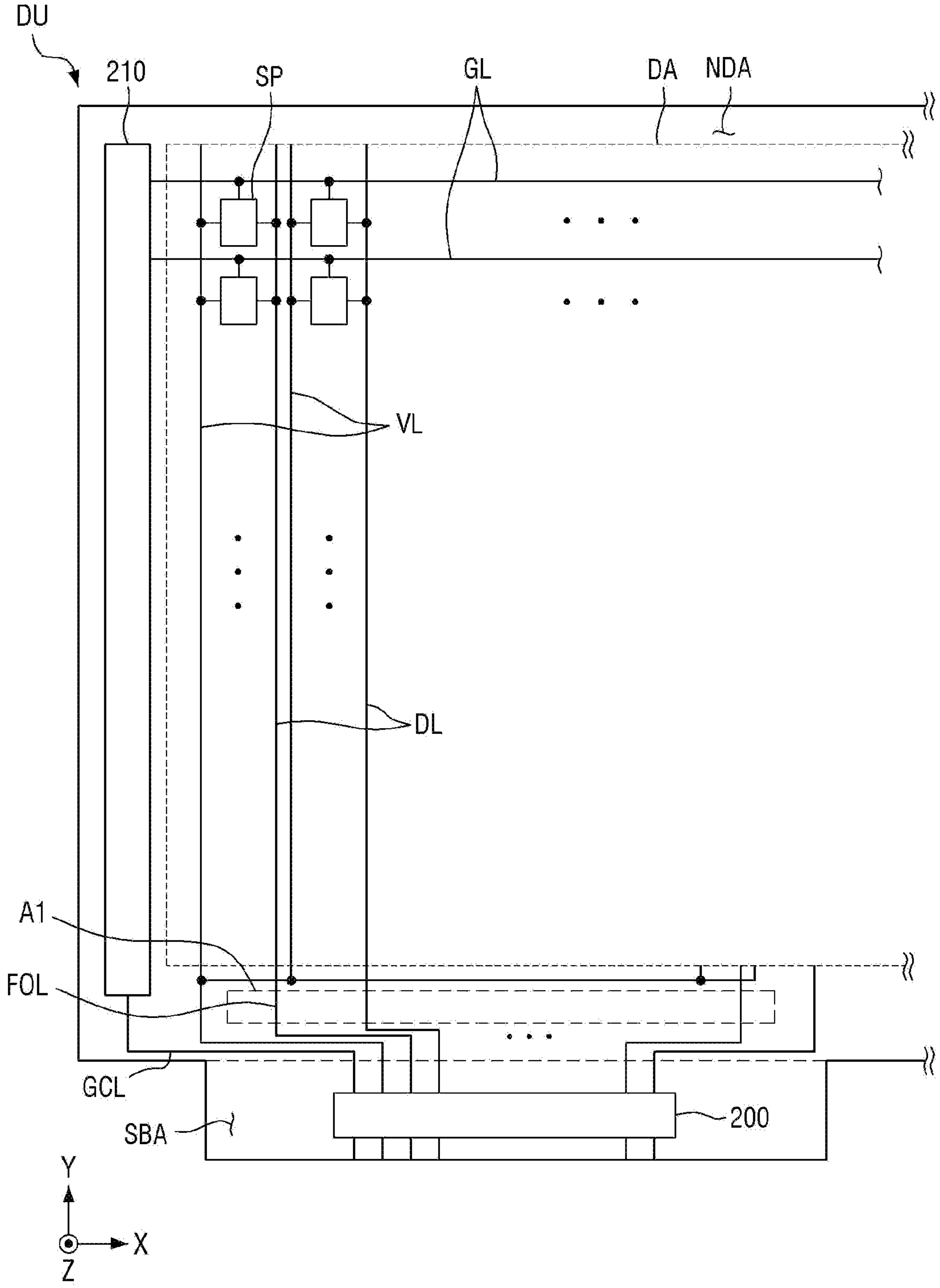
FIG. 3 is a layout view schematically illustrating an example of a display panel according to an embodiment.

FIG. 3 is a layout view schematically illustrating an example of a display panel according to an embodiment. Specifically, FIG. 3 is a layout view illustrating a display area DA and a non-display area NDA of the display unit DU before the touch sensing unit TSU is formed or attached.

The display area DA, which is an area displaying an image, may be defined as a central area of the display panel 100. The display area DA may include a plurality of sub-pixels SP, gate lines GL, data lines DL, and a plurality of power lines VL. Each of the plurality of sub-pixels SP may be a minimum unit for outputting light.

The gate lines GL may supply the gate signal received from the gate driving unit 210 to the plurality of sub-pixels SP. The gate lines GL may extend in an X-axis direction and may be spaced apart from each other in a Y-axis direction intersecting the X-axis direction.

The data lines DL may supply the data voltage applied from the display driving circuit 200 to the plurality of sub-pixels SP. The data lines DL may extend in the Y-axis direction to intersect the gate lines GL and may be spaced apart from each other in the X-axis direction.

The power lines VL may supply the power voltage applied from the display driving circuit 200 to the plurality of sub-pixels SP. Here, the power voltage may be at least one of a driving voltage, an initialization voltage, and a reference voltage. The power lines VL may extend in the Y-axis direction and may be spaced apart from each other in the X-axis direction.

The non-display area NDA may surround the display area DA. The non-display area NDA may include a gate driving unit 210, fan-out lines FOL, and gate control lines GCL. The gate driving unit 210 may generate a plurality of gate signals based on the gate control signals input through the gate control lines GCL and may sequentially supply the plurality of gate signals to the gate lines GL according to a set order.

The fan-out lines FOL may extend from the display driving circuit 200 to the data lines DL of the display area DA. The fan-out lines FOL may supply the data voltage received from the display driving circuit 200 to the data lines DL corresponding thereto in a one-to-one manner.

The gate control lines GCL may extend from the display driving circuit 200 to the gate driving unit 210. The display driving circuit 200 may supply the gate control signals to the gate driving unit 210 through the gate control lines GCL. The gate control lines GCL may supply the gate control signals received from the display driving circuit 200 to the gate driving unit 210.

The display driving circuit 200 may output signals and voltages for driving the display panel 100 through the fan-out lines FOL. Specifically, the display driving circuit 200 may supply the data voltage to each of the data lines DL through the fan-out lines FOL. The data voltage may be supplied to the plurality of sub-pixels SP and may determine luminance of the plurality of sub-pixels SP.

In the non-display area NDA in which the fan-out lines FOL, the gate control lines GCL, and lead lines are disposed, line number identification patterns for facilitating identification of defects that may occur during the manufacturing process of the display panel 100 and repair may be formed. In addition, line number identification patterns may also be formed in the display area DA in which the gate lines GL, the data lines DL, and the power lines VL are disposed.

The line number identification patterns may be formed and disposed to overlap at least one of the fan-out lines FOL, the gate control lines GCL, the lead lines, the gate lines GL, the data lines DL, and the power lines VL. In addition, the line number identification patterns may be disposed at positions respectively adjacent to the lines or may be disposed between adjacent lines.

The line number identification patterns may be visually read or identified through a microscope or the like. In addition, the line number identification patterns may be detected by an image sensor, a camera, a light reflection pattern detection module, and the like, and thus may be identified through an image sensor, camera, light reflection pattern detection module, and the like.

Hereinafter, an example in which the line number identification patterns overlap one or more lines of the fan-out lines FOL in the non-display area NDA or are formed and disposed between the fan-out lines FOL will be described. As described above, the positions where the line number identification patterns are formed and disposed are not limited to the non-display area NDA in which the fan-out lines FOL are formed. In other words, the line number identification patterns may be formed and disposed at positions where various lines such as the gate control lines GCL, the gate lines GL, the data lines DL, the lead lines, and the power lines VL are disposed.

The fan-out lines FOL and the data lines DL may be integrally formed but are not limited thereto. In an embodiment, the fan-out lines FOL and the data lines DL may be formed on different process layers and electrically connected to each other by a contact hole or the like.

Figure 4:
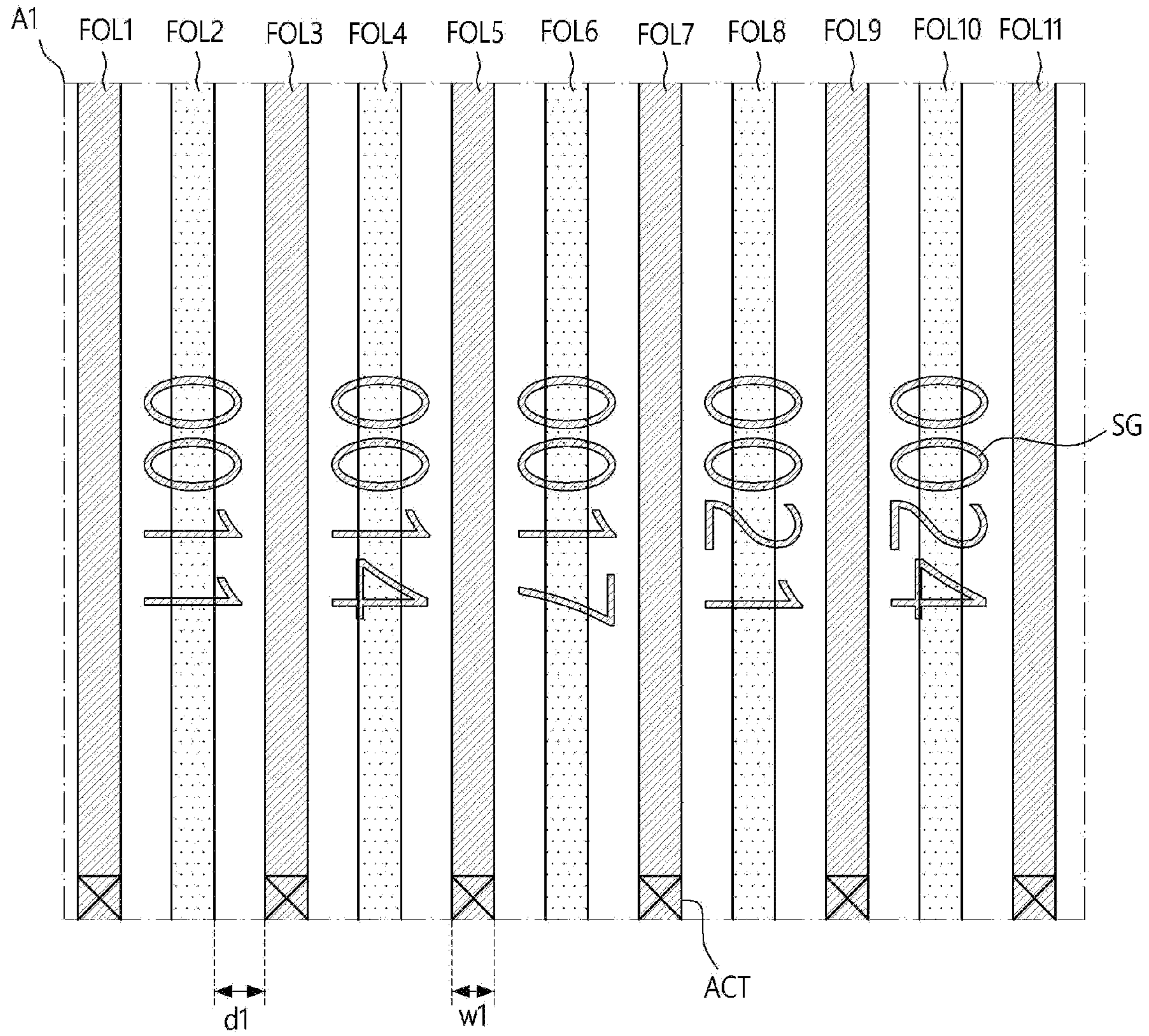
FIG. 4 is an enlarged view specifically illustrating the area A1 of FIG. 3 according to a first embodiment of the present disclosure.

FIG. 4 is an enlarged view specifically illustrating the area A1 of FIG. 3 according to a first embodiment of the present disclosure.

Referring to FIG. 4, in an area where the fan-out lines FOL are disposed, line number identification patterns SG are formed and disposed together with the fan-out lines FOL. The line number identification patterns SG may overlap the fan-out lines FOL or may be at positions adjacent to the fan-out lines FOL. In either case, the line number identification patterns SG may be in a floating state. The line number identification patterns SG formed at the positions adjacent to the fan-out lines FOL may be identification patterns capable of identifying line numbers of the data lines DL connected to the fan-out lines FOL in a one-to-one manner. As another example, the line number identification patterns SG formed to overlap the gate control lines GCL or formed at positions adjacent to the gate control lines GCL in an area where the gate control lines GCL are disposed may be identification patterns capable of identifying line numbers of the gate control lines GCL. As still another example, the line number identification patterns SG formed to overlap the gate lines GL or formed at positions adjacent to the gate lines GL in the non-display area may be identification patterns capable of identifying line numbers of the gate lines GL. The line number identification patterns SG may also be formed on the power lines VL or the lead lines.

Referring to FIG. 4, the line number identification patterns SG representing the line numbers of the data lines DL may be formed and disposed side by side at preset intervals in the area in which the fan-out lines FOL are disposed (e.g., area A1). At least one fan-out line FOL among the fan-out lines FOL may be each formed and disposed in an area between the number identification patterns SG so as not to overlap the number identification patterns SG. In addition, at least one other fan-out line FOL among the fan-out lines FOL may be each formed and disposed in the area in which the fan-out lines FOL are disposed so as to each overlap at least one line number identification pattern SG with an insulating layer interposed therebetween.

As an example, the line number identification patterns SG and fan-out lines FOL1, FOL3, FOL5, FOL7, FOL9, FOL11, . . . among the fan-out lines FOL do not to overlap, may be disposed in the area in which the fan-out lines FOL are disposed, and may be formed with the same material through the same patterning process. In this case, the line number identification patterns SG are formed and disposed in areas between the fan-out lines FOL1, FOL3, FOL5, FOL7, FOL9, FOL11, . . . which are preset or located so as not to overlap the line number identification patterns SG. Thereafter, an insulating layer is formed to cover the line number identification patterns SG and all of the fan-out lines FOL1, FOL3, FOL5, FOL7, FOL9, FOL11, . . . that do not overlap the line number identification patterns SG. In the area in which the fan-out lines FOL on which the insulating layer is formed are disposed, fan-out lines FOL2, FOL4, FOL6, FOL8, FOL10, . . . may be formed and disposed to overlap each of the line number identification patterns SG with the insulating layer interposed therebetween.

A size of the line number identification patterns SG or a formation width of the line number identification patterns SG may be smaller than a sum of a distance d1 between two adjacent fan-out lines FOL and widths w1+w1 of two fan-out lines FOL. In this case, odd-numbered fan-out lines FOL1, FOL3, FOL5, FOL7, FOL9, FOL11, . . . or even-numbered fan-out lines FOL2, FOL4, FOL6, FOL8, FOL10, . . . among the fan-out lines FOL may overlap respective line number identification patterns SG with the insulating layer interposed therebetween.

For example, as illustrated in FIG. 4, the odd-numbered fan-out lines FOL1, FOL3, FOL5, FOL7, FOL9, FOL11, . . . among fan-out lines FOL and the line number identification patterns SG may be disposed in the area in which the fan-out lines FOL are disposed and may be formed with the same material through the same patterning process. In this case, each of the line number identification patterns SG may be respectively disposed in areas between the odd-numbered fan-out lines FOL1, FOL3, FOL5, FOL7, FOL9, FOL11, . . . . On the other hand, the even-numbered fan-out lines FOL2, FOL4, FOL6, FOL8, FOL10, . . . among the fan-out lines FOL are formed and disposed in the area in which the fan-out lines FOL are disposed and respectively overlap the line number identification patterns SG with the insulating layer interposed therebetween.

The odd-numbered fan-out lines FOL1, FOL3, FOL5, FOL7, FOL9, FOL11, . . . that do not overlap the line number identification patterns SG and the even-numbered fan-out lines FOL2, FOL4, FOL6, FOL8, FOL10, . . . that overlap the line number identification patterns SG may be disposed on different layers with the insulating layer interposed therebetween. Accordingly, at least one line of the odd-numbered fan-out lines FOL1, FOL3, FOL5, FOL7, FOL9, FOL11, . . . that do not overlap the line number identification patterns SG and the even-numbered fan-out lines FOL2, FOL4, FOL6, FOL8, FOL10, . . . that overlap the line number identification patterns SG may be connected to each of the data lines DL in a one-to-one manner through at least one contact hole ACT or the like.

Figure 5:
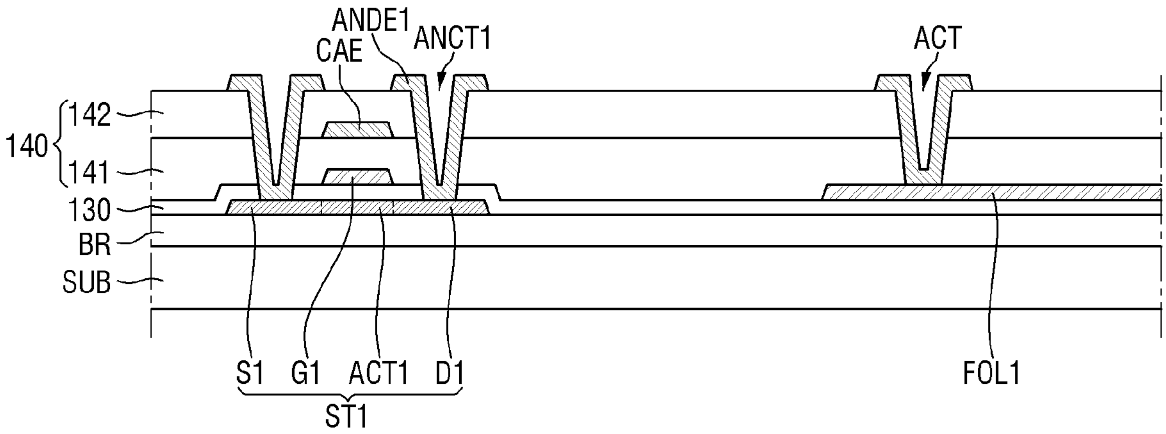
FIG. 5 is a cross-sectional view illustrating a cross-sectional structure of a thin film transistor and a first fan-out line formed on a substrate.

FIG. 5 is a cross-sectional view illustrating a cross-sectional structure of any one thin film transistor and a first fan-out line formed on a substrate.

Referring to FIG. 5, a substrate SUB may be made of an insulating material such as a polymer resin. For example, the substrate SUB may be made of polyimide, glass, or the like. The substrate SUB may be a flexible substrate that may be bent, folded, rolled, or the like. Alternatively, the substrate SUB may be a flat substrate.

A barrier layer BR may be first formed on the substrate SUB. The barrier layer BR is a film for protecting the thin film transistors of the thin film transistor layer (TFTL in FIG. 2) and the light emitting layer of the light emitting element layer (EML in FIG. 2) from moisture permeating through the substrate SUB, which otherwise may be vulnerable to moisture permeation. The barrier layer BR may include a plurality of inorganic layers alternately stacked. For example, the barrier layer BR may be formed as a multilayer layer in which one or more inorganic layers of a silicon nitride layer, a silicon oxynitride layer, a silicon oxide layer, a titanium oxide layer, and an aluminum oxide layer are alternately stacked.

Thin film transistors ST1 are disposed on the barrier layer BR of the display area DA. On the other hand, the fan-out lines FOL1, FOL3, FOL5, FOL7, FOL9, FOL11, . . . that are preset so as not to overlap the line number identification patterns SG in the area in which the fan-out lines FOL are disposed may be formed on the barrier layer BR in the non-display area NDA.

Specifically, an active layer ACT1, a source electrode S1, and a drain electrode D1 of each of the thin film transistors ST1 may be disposed on the barrier layer BR in the display area DA. Here, the active layer ACT1 of the thin film transistor ST1 includes a doping material of at least one of polycrystalline silicon, single crystal silicon, low-temperature polycrystalline silicon, amorphous silicon, and an oxide semiconductor. Accordingly, the active layer ACT1 overlapping the gate electrode G1 in the third direction (Z-axis direction), which is a thickness direction of the substrate SUB, may be defined as a channel region. Meanwhile, the source electrode S1 and the drain electrode D1 are regions that do not overlap the gate electrode G1 in the third direction (Z-axis direction) and may have conductivity by doping a silicon semiconductor or an oxide semiconductor with ions or impurities.

A gate insulating layer 130 may be disposed on the active layer ACT1, the source electrode S1, and the drain electrode D1 of the thin film transistor ST1. The gate insulating layer 130 may be formed of an inorganic layer, for example, a silicon nitride layer, a silicon oxynitride layer, a silicon oxide layer, a titanium oxide layer, or an aluminum oxide layer.

The gate electrode G1 of the thin film transistor ST1 may be disposed on the gate insulating layer 130. The gate electrode G1 overlaps the active layer ACT1 in the third direction (Z-axis direction). The gate electrode G1 may be formed as a single layer or multiple layers each made of any one of molybdenum (Mo), aluminum (Al), chromium (Cr), gold (Au), titanium (Ti), nickel (Ni), neodymium (Nd), and copper (Cu), or an alloy thereof.

Similarly, the line number identification patterns SG and the fan-out lines FOL1, FOL3, FOL5, FOL7, FOL9, FOL11, . . . may be on the barrier layer BR in the non-display area NDA, may contain the same material as the gate electrode G1, and may be formed through the same patterning process that forms the gate electrode G1. The fan-out lines FOL1, FOL3, FOL5, FOL7, FOL9, FOL11, . . . are disposed in preset positions and areas so as not to overlap the line number identification patterns SG.

As described above, one or more fan-out lines FOL1, FOL3, FOL5, FOL7, FOL9, FOL11, . . . among the fan-out lines FOL that do not overlap the line number identification patterns SG may be made of the same material as the gate electrode G1 of the thin film transistor ST1 and formed through the same patterning process that forms the gate electrode G1.

At least one fan-out line FOL1, FOL3, FOL5, FOL7, FOL9, FOL11, . . . among the fan-out lines FOL1, FOL3, FOL5, FOL7, FOL9, FOL11, . . . that do not to overlap the line number identification patterns SG may be connected to at least one of the data lines DL in a one-to-one manner through at least one contact hole ACT or the like.

A first interlayer insulating layer 141 is formed on front surfaces of the gate electrode G1 of the thin film transistor ST1, the fan-out lines FOL1, FOL3, FOL5, FOL7, FOL9, FOL11, . . . , and the line number identification patterns SG. The first interlayer insulating layer 141 may be formed as an inorganic layer, for example, a silicon nitride layer, a silicon oxynitride layer, a silicon oxide layer, a titanium oxide layer, or an aluminum oxide layer. The first interlayer insulating layer 141 may contain multiple inorganic layers.

A capacitor electrode CAE may be disposed on the first interlayer insulating layer 141. The capacitor electrode CAE may overlap the gate electrode G1 of the thin film transistor ST1 in the third direction (Z-axis direction). Since the first interlayer insulating layer 141 has a predetermined dielectric constant, a capacitor may be formed by the capacitor electrode CAE, the gate electrode G1, and the first interlayer insulating layer 141 disposed between the capacitor electrode CAE and the gate electrode G1. The capacitor electrode CAE may be formed as a single layer or multiple layers each made of any one of molybdenum (Mo), aluminum (Al), chromium (Cr), gold (Au), titanium (Ti), nickel (Ni), neodymium (Nd), and copper (Cu), or an alloy thereof.

Thereafter, a second interlayer insulating layer 142 may be disposed on the capacitor electrode CAE. The second interlayer insulating layer 142 may be formed as an inorganic layer, for example, a silicon nitride layer, a silicon oxynitride layer, a silicon oxide layer, a titanium oxide layer, or an aluminum oxide layer. The second interlayer insulating layer 142 may contain multiple inorganic layers.

A first anode connection electrode ANDE1 may be disposed on the second interlayer insulating layer 142. The first anode connection electrode ANDE1 may be connected to the drain electrode D1 of the thin film transistor ST1 through a first connection contact hole ANCT1 penetrating through the gate insulating layer 130, the first interlayer insulating layer 141, and the second interlayer insulating layer 142. The first anode connection electrode ANDE1 may be formed as a single layer or multiple layers each made of any one of molybdenum (Mo), aluminum (Al), chromium (Cr), gold (Au), titanium (Ti), nickel (Ni), neodymium (Nd), and copper (Cu), or alloys thereof.

Figure 6:
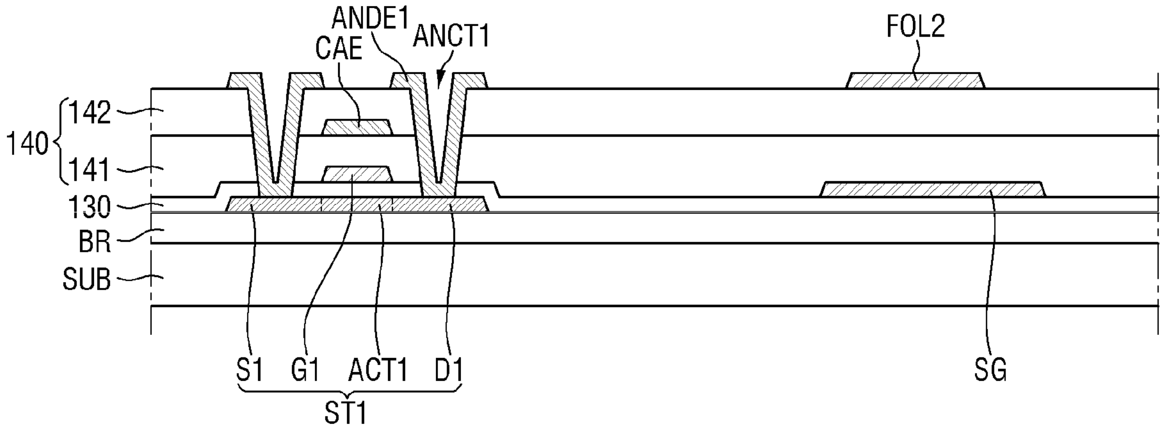
FIG. 6 is a cross-sectional view illustrating a cross-sectional structure of a thin film transistor, a line number identification pattern, and a second fan-out line formed on a substrate.

FIG. 6 is a cross-sectional view illustrating a cross-sectional structure of any one thin film transistor, a line number identification pattern, and a second fan-out line formed on a substrate.

Referring to FIG. 6, a gate insulating layer 130 may be disposed on the active layer ACT1, the source electrode S1, and the drain electrode D1 of the thin film transistor ST1. The gate electrode G1 of the thin film transistor ST1 may be disposed on the gate insulating layer 130. The gate electrode G1 may overlap the active layer ACT1 in the third direction (Z-axis direction).

The line number identification patterns SG may contain the same material as the gate electrode G1 of the thin film transistor ST1 and may be formed through the same patterning process that forms the gate electrode G1. In this case, the fan-out lines FOL1, FOL3, FOL5, FOL7, FOL9, FOL11, . . . that are preset so as not to overlap the line number identification patterns SG are also formed through the same patterning process that forms the gate electrode G1 and the line number identification patterns SG.

A first interlayer insulating layer 141 is formed on front surfaces of the gate electrode G1 of the thin film transistor ST1 and the gate insulating layer 130 including the fan-out lines FOL1, FOL3, FOL5, FOL7, FOL9, FOL11, . . . that do not overlap the line number identification patterns SG.

A capacitor electrode CAE may be disposed on the first interlayer insulating layer 141. The capacitor electrode CAE may overlap the gate electrode G1 of the thin film transistor ST1 in the third direction (Z-axis direction). In this case, the fan-out lines FOL2, FOL4, FOL6, FOL8, FOL10, . . . that are set so as to overlap the line number identification patterns SG may be formed on the first interlayer insulating layer 141 through the same patterning process that forms the capacitor electrode CAE. Alternatively, one or more fan-out lines FOL2, FOL4, FOL6, FOL8, FOL10, . . . among the fan-out lines FOL that overlap the line number identification patterns SG may contain the same material as electrodes other than the capacitor electrode CAE, such as the first anode connection electrode ANDE1 or the common electrode and may be formed through the same patterning process that forms the other electrodes.

Specifically, the first anode connection electrode ANDE1 may be disposed on the second interlayer insulating layer 142. The first anode connection electrode ANDE1 may be connected to the drain electrode D1 of the thin film transistor ST1 through a first connection contact hole ANCT1 penetrating through the gate insulating layer 130, the first interlayer insulating layer 141, and the second interlayer insulating layer 142.

At least one fan-out line FOL2, FOL4, FOL6, FOL8, FOL10, . . . among the one or more fan-out lines FOL2, FOL4, FOL6, FOL8, FOL10, . . . that overlap the line number identification patterns SG may be respectively connected to at least one of the data lines DL in a one-to-one manner through at least one contact hole or the like as needed.

As the odd-numbered and even-numbered fan-out lines FOL are formed and disposed through different patterning processes, the gap or lateral separation between adjacent fan-out lines FOL may be further narrowed in high resolution. In addition, the odd-numbered and even-numbered fan-out lines FOL may be formed and disposed in as parallel straight lines in the line arrangement area as shown in FIG. 4.

Figure 7:
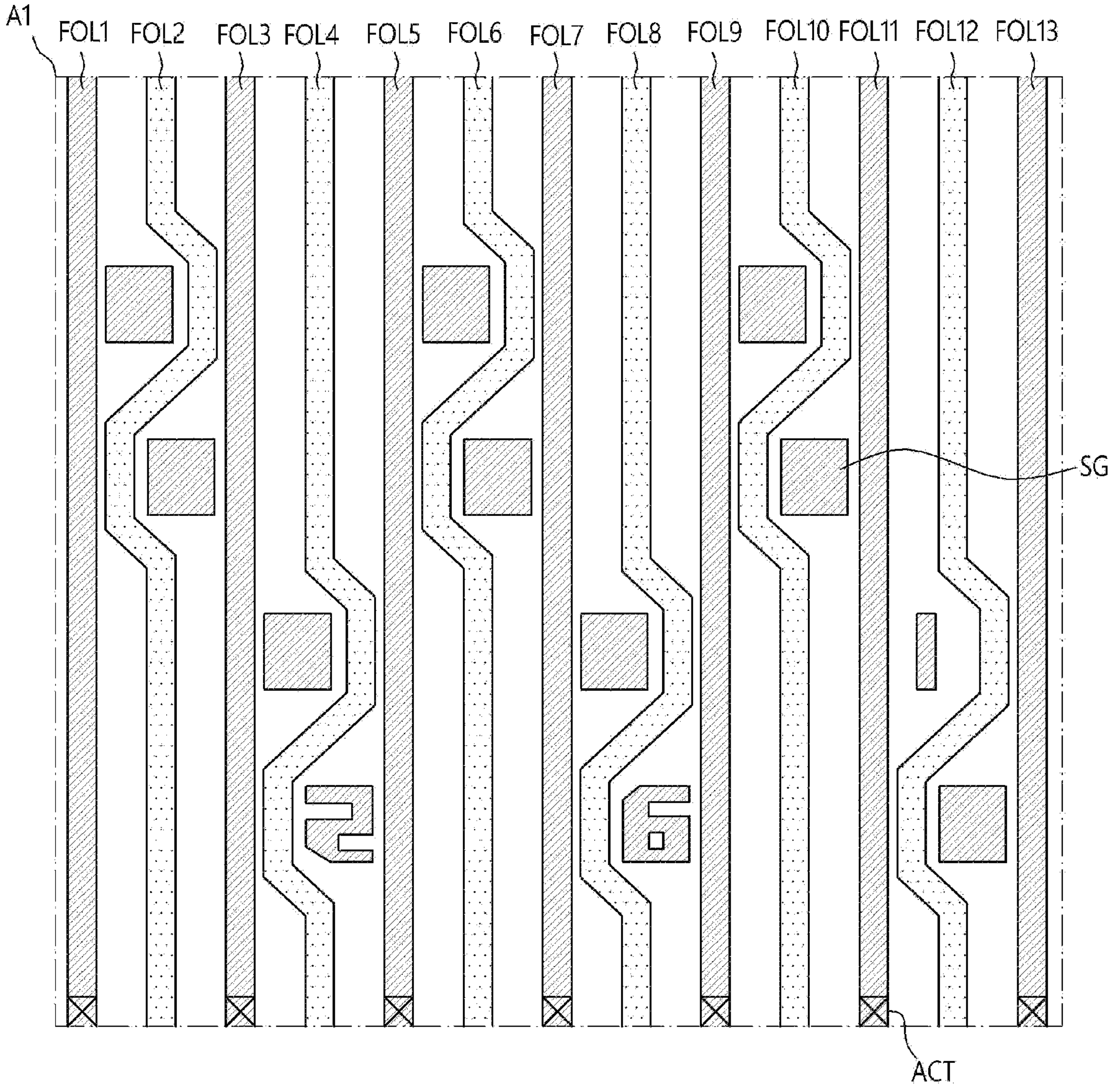
FIG. 7 is an enlarged view specifically illustrating the area A1 of FIG. 3 according to a second embodiment of the present disclosure.

FIG. 7 is an enlarged view specifically illustrating the area A1 of FIG. 3 according to a second embodiment of the present disclosure. In addition, FIG. 8 is an enlarged view specifically illustrating the area A1 of FIG. 3 according to a third embodiment of the present disclosure.

Figure 8:
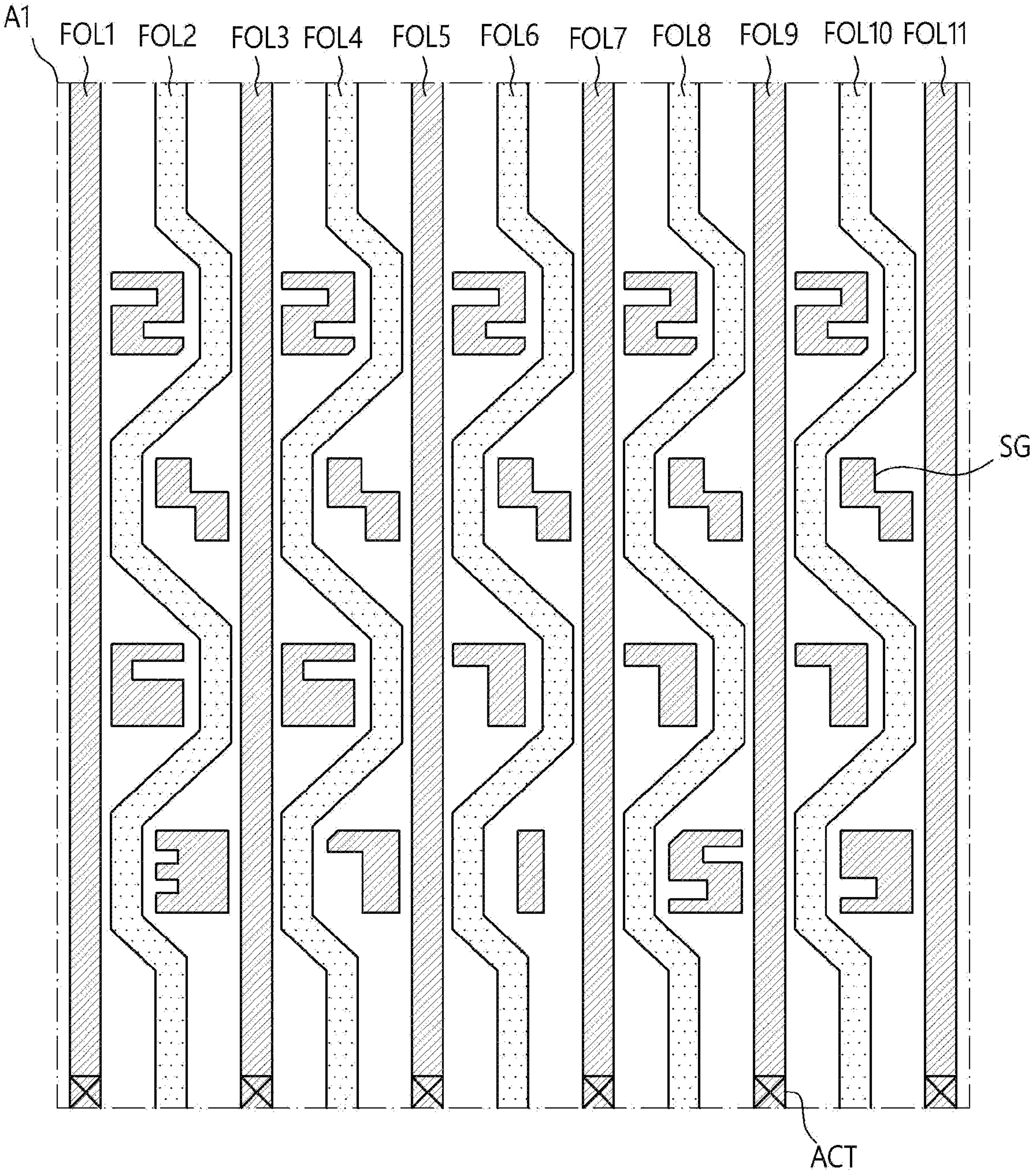
FIG. 8 is an enlarged view specifically illustrating the area A1 of FIG. 3 according to a third embodiment of the present disclosure.

Referring to FIGS. 7 and 8, the line number identification patterns SG capable of identifying the line numbers of the data lines DL connected to the fan-out lines FOL in a one-to-one manner are formed and disposed in the area in which the fan-out lines FOL are disposed. The line number identification patterns SG, more specifically, are formed and disposed at positions adjacent to the fan-out lines FOL so as not to be electrically connected to the fan-out lines FOL and so that the line number identification patterns SG may be in a floating state.

The line number identification patterns SG formed at the positions adjacent to the fan-out lines FOL are identification patterns capable of identifying line numbers of the data lines DL connected to the fan-out lines FOL in a one-to-one manner. The line number identification patterns SG may also or alternatively be formed at positions adjacent to lines such as the gate control lines GCL, the gate lines GL, and the power lines VL. That is, the line number identification patterns SG may be disposed at respective side positions adjacent to respective lines so as not to be electrically connected to any of the adjacent lines or may be disposed in areas between pairs of the lines disposed adjacent to each other among the lines.

In the examples of FIGS. 7 and 8, the first fan-out lines FOL1, FOL3, FOL5, FOL7, FOL9, FOL11, FOL13, . . . among the fan-out lines FOL may be formed simultaneously with the line number identification patterns SG through the same patterning process that forms the line number identification patterns SG.

At least one interlayer insulating layer such as a gate insulating layer is formed to cover all of the first fan-out lines FOL1, FOL3, FOL5, FOL7, FOL9, FOL11, FOL13, . . . , including the line number identification patterns SG. Second fan-out lines FOL2, FOL4, FOL6, FOL8, FOL10, FOL12 . . . unlike the first fan-out lines FOL1, FOL3, FOL5, FOL7, FOL9, FOL11, FOL13, . . . are formed and disposed on the interlayer insulating layer.

The second fan-out lines FOL2, FOL4, FOL6, FOL8, FOL10, FOL12 . . . unlike the first fan-out lines FOL1, FOL3, FOL5, FOL7, FOL9, FOL11, FOL13, . . . among the fan-out lines FOL are formed and disposed on a different layer from the first fan-out lines FOL1, FOL3, FOL5, FOL7, FOL9, FOL11, FOL13, . . . and the line number identification patterns SG with at least one interlayer insulating layer interposed therebetween.

The first fan-out lines FOL1, FOL3, FOL5, FOL7, FOL9, FOL11, FOL13, . . . may be the odd-numbered fan-out lines FOL1, FOL3, FOL5, FOL7, FOL9, FOL11, FOL13, . . . among all fan-out lines FOL. Unlike this, the second fan-out lines FOL2, FOL4, FOL6 FOL8, FOL10, FOL12, . . . may be the even-numbered fan-out lines FOL2, FOL4, FOL6, FOL8, FOL10, FOL12, . . . among all fan-out lines FOL.

In the illustrated example, the first fan-out lines FOL1, FOL3, FOL5, FOL7, FOL9, FOL11, FOL13, . . . among the fan-out lines FOL are straight lines and uniformly spaced apart in the area A1 in which the fan-out lines FOL are disposed. In addition, at least one line number identification pattern SG may be formed and disposed in areas between the first fan-out lines FOL1, FOL3, FOL5, FOL7, FOL9, FOL11, FOL13, . . . respectively adjacent to at least one corresponding first fan-out lines FOL1, FOL3, FOL5, FOL7, FOL9, FOL11, FOL13, . . . .

As illustrated in FIG. 7, two line number identification patterns SG may be disposed in each of the areas between an adjacent pair of the first fan-out lines FOL1, FOL3, FOL5, FOL7, FOL9, FOL11, FOL13, . . . . On the other hand, as illustrated in FIG. 8, at least four line number identification patterns SG may be disposed in each of the areas between an adjacent pair of the first fan-out lines FOL1, FOL3, FOL5, FOL7, FOL9, FOL11, FOL13, . . . .

Odd-numbered first fan-out lines FOL1, FOL3, FOL5, FOL7, FOL9, FOL11, FOL13, . . . and even-numbered second fan-out lines FOL2, FOL4, FOL6, FOL8, FOL10, FOL12 . . . are alternately disposed (in plan view) with at least one insulating layer interposed between the odd-numbered first fan-out lines FOL1, FOL3, FOL5, FOL7, FOL9, FOL11, FOL13, . . . and even-numbered second fan-out lines FOL2, FOL4, FOL6, FOL8, FOL10, FOL12 . . . .

The even-numbered second fan-out lines FOL2, FOL4, FOL6, FOL8, FOL10, FOL12 . . . may be bent at least once so as not to overlap the line number identification patterns SG formed and disposed on another layer and may therefore have a longer length than the odd-numbered first fan-out lines FOL1, FOL3, FOL5, FOL7, FOL9, FOL11, FOL13, . . . .

The even-numbered second fan-out lines FOL2, FOL4, FOL6, FOL8, FOL10, FOL12 . . . shown in FIGS. 7 and 8 include at least one bent portion bent in a shape respectively surrounding a side surface of at least one of the line number identification patterns SG formed and disposed on another layer with the insulating layer interposed therebetween. As illustrated in FIGS. 7 and 8, the at least one bent portion may be formed in a variety of shapes, for example, including at least one of a "C" shape, an inverted or mirrored "C" shape, an "S" shape, an inverted or mirrored "S" shape, a "ㄷ" shape, an inverted or mirrored "ㄷ" shape, a "ㄹ" shape, and an inverted or mirrored "ㄹ" shape, or a combination thereof in plan view.

Figure 9:
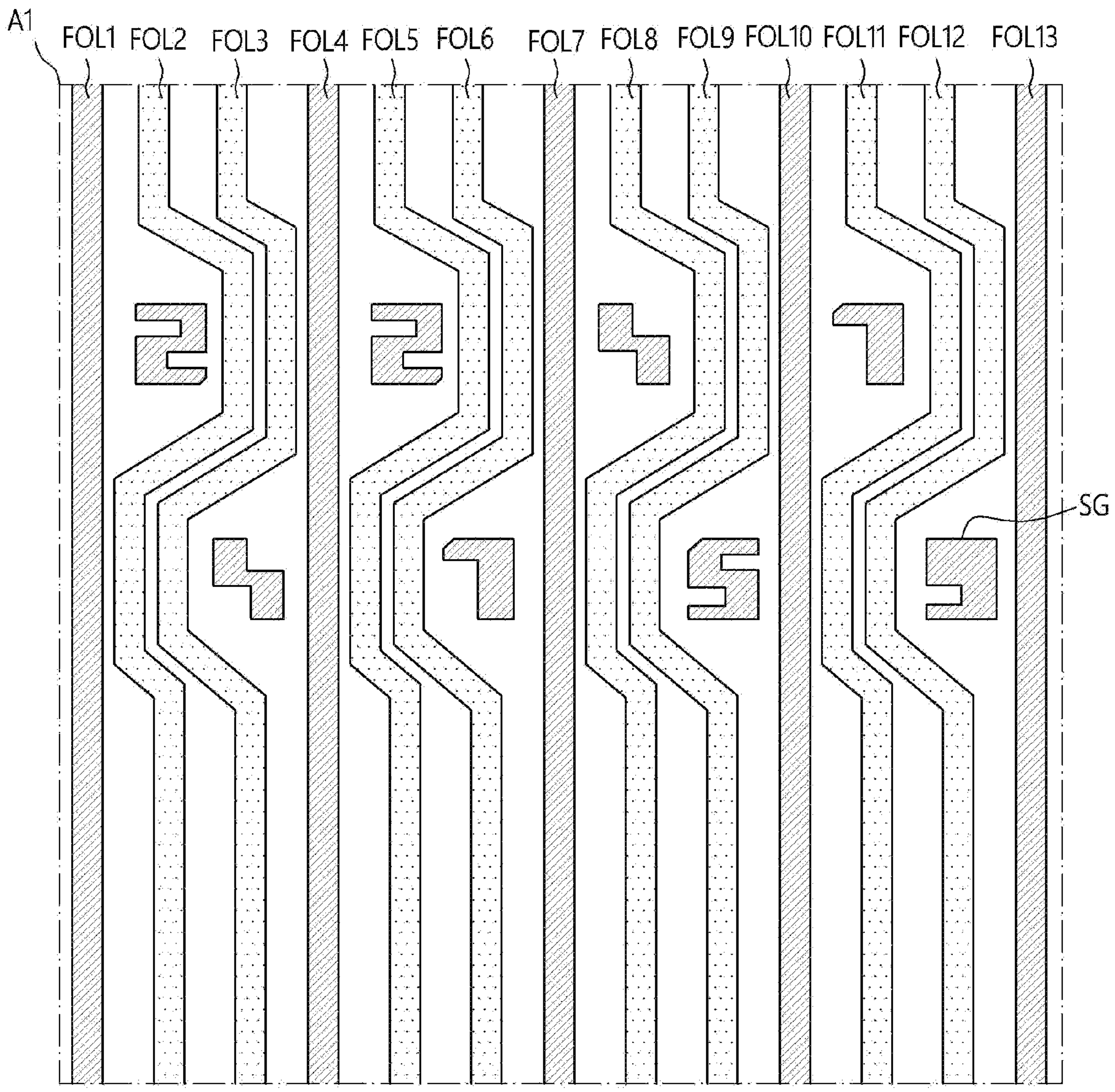
FIG. 9 is an enlarged view specifically illustrating the area A1 of FIG. 3 according to a fourth embodiment of the present disclosure.

FIG. 9 is an enlarged view specifically illustrating the area A1 of FIG. 3 according to a fourth embodiment of the present disclosure.

Referring to FIG. 9, 3n−2-th fan-out lines FOL(3n−2 (where n is a positive integer)) among the fan-out lines FOL are formed and disposed simultaneously with the line number identification patterns SG using the same patterning process that forms the line number identification patterns SG. The 3n−2-th fan-out lines FOL(3n−2) are sometimes referred to herein as the first fan-out lines.

Among the fan-out lines FOL, 3n−1-th and 3n-th fan-out lines FOL(3n−1) and FOL(3n), which are sometimes referred to herein as the second fan-out lines of the fourth embodiment, are formed and disposed on a different layer from the 3n−2-th fan-out lines FOL(3n−2) and the line number identification patterns SG with at least one insulating layer (a gate insulating layer or an interlayer insulating layer) interposed therebetween.

As illustrated in FIG. 9, at least one (e.g., two or four) line number identification pattern SG may be formed and disposed between the 3n−2-th fan-out lines FOL(3n−2) and the adjacent 3n−1-th fan-out lines FOL(3n−1). Similarly, at least one line number identification pattern SG may be formed and disposed between the 3n−1-th fan-out lines FOL(3n−1) and the adjacent 3n-th fan-out lines FOL(3n)

Lengths of the 3n−2-th fan-out lines and the 3n−1-th and 3n-th fan-out lines FOL(3n−1) and FOL(3n) may be different from each other according to the number and arrangement position of the line number identification patterns SG.

The 3n−1-th and 3n-th fan-out lines FOL(3n−1) and FOL(3n) among the fan-out lines FOL may be bent at least once so as not to overlap or be electrically connected to the line number identification patterns SG. Specifically, the 3n−1-th and 3n-th fan-out lines FOL(3n−1) and FOL(3n) include one or more first and second bent portions bent in a shape surrounding at least one side surface of the line number identification patterns SG.

As illustrated in FIG. 9, the one or more first and second bent portions may be formed in at least one of a "C" shape, an inverted or mirrored "C" shape, an "S" shape, an inverted or mirrored "S" shape, a "ㄷ" shape, an inverted or mirrored "ㄷ" shape, a "ㄹ" shape, and an inverted or mirrored "ㄹ" shape, or a combination thereof in plan view.

Figure 10:
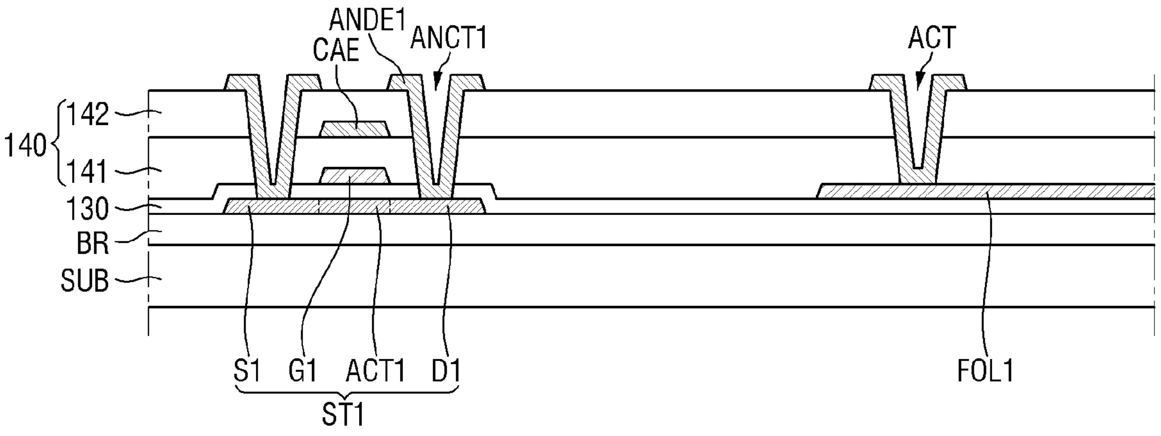
FIG. 10 is a cross-sectional view illustrating the structure of a thin film transistor and a first fan-out line according to any of the second to fourth embodiments.

FIG. 10 is a cross-sectional view illustrating a cross-sectional structure of any one thin film transistor and the first fan-out line according to the second to fourth embodiments formed on a substrate.

Referring to FIG. 10, the thin film transistors ST1 are disposed on the barrier layer BR in the display area DA. On the other hand, the first fan-out line FOL1 may be formed on the barrier layer BR in the non-display area NDA at a location disconnected from the line number identification patterns SG.

A gate insulating layer 130 may be disposed on the active layer ACT1, the source electrode S1, and the drain electrode D1 of the thin film transistor ST1. The gate electrode G1 of the thin film transistor ST1 may be disposed on the gate insulating layer 130. The gate electrode G1 overlaps the active layer ACT1 in the third direction (Z-axis direction).

On the other hand, the line number identification patterns SG and the fan-out line FOL1 may be formed on the barrier layer BR of the non-display area NDA with the same material as the gate electrode G1 through the same patterning process that forms the gate electrode G1. The fan-out line FOL1 and other fan-out lines FOL formed on the barrier layer BR may be disposed in preset positions and areas so as not to overlap the line number identification patterns SG, which may also be formed on the barrier layer BR.

Fan-out line FOL1 . . . and the other fan-out lines FOL that do not to overlap the line number identification patterns SG may be connected to the data lines DL in a one-to-one manner through respective contact holes ACT or the like.

A first interlayer insulating layer 141 is formed on front surfaces of the gate electrode G1 of the thin film transistor ST1, the fan-out line FOL1, the other fan-out lines FOL disposed on the barrier layer BR, and the line number identification patterns SG.

A capacitor electrode CAE may be disposed on the first interlayer insulating layer 141. The capacitor electrode CAE may overlap the gate electrode G1 of the thin film transistor ST1 in the third direction (Z-axis direction). Thereafter, a second interlayer insulating layer 142 may be disposed on the capacitor electrode CAE.

A first anode connection electrode ANDE1 may be disposed on the second interlayer insulating layer 142. The first anode connection electrode ANDE1 may be connected to the drain electrode D1 of the thin film transistor ST1 through a first connection contact hole ANCT1 penetrating through the gate insulating layer 130, the first interlayer insulating layer 141, and the second interlayer insulating layer 142.

Figure 11:
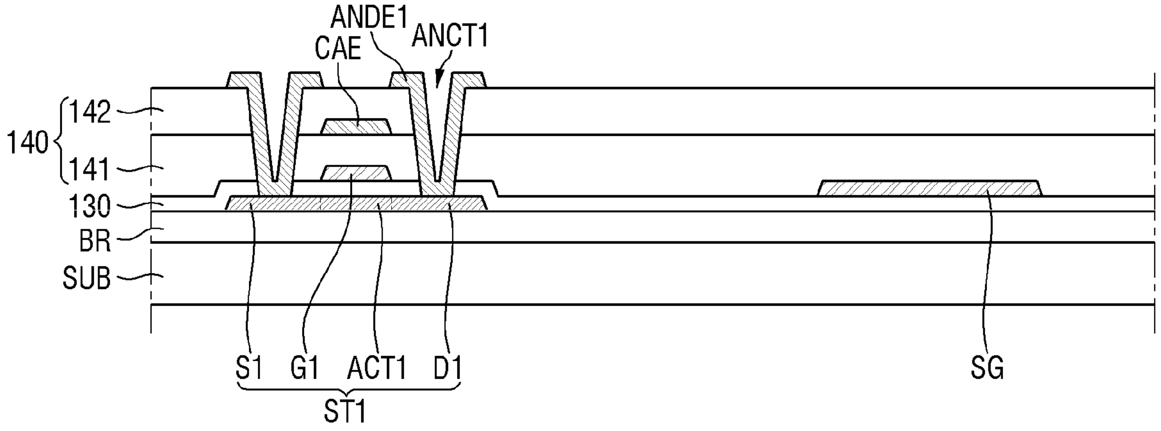
FIG. 11 is a cross-sectional view illustrating the structure of a thin film transistor and a line number identification pattern according to any of the second to fourth embodiments.

FIG. 11 is a cross-sectional view illustrating a cross-sectional structure of any one thin film transistor and any one line number identification pattern according to the second to fourth embodiments formed on a substrate.

Referring to FIG. 11, the line number identification patterns SG may be formed on the barrier layer BR on the substrate SUB in the non-display area NDA simultaneously with formation of the first fan-out line FOL1 and other first fan-out lines in the area A1.

The line number identification patterns SG and the first fan-out line FOL1 may be formed of the same material as any electrode (e.g., the gate electrode G1 of the thin film transistor ST1) through the same patterning process that forms the electrode.

Figure 12:
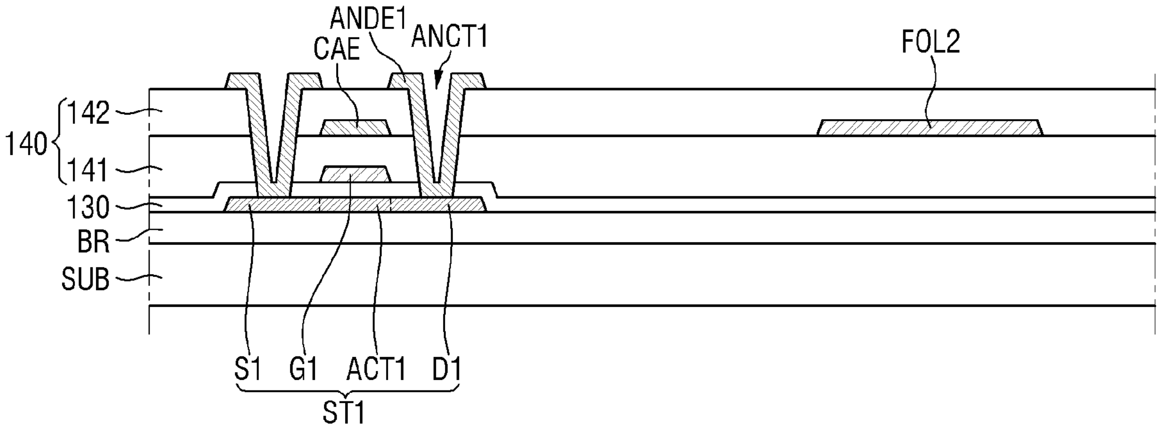
FIG. 12 is a cross-sectional view illustrating the structure of a thin film transistor and a second fan-out line according to any of the second to fourth embodiments.

FIG. 12 is a cross-sectional view illustrating a cross-sectional structure of any one thin film transistor and any one second fan-out line according to the second to fourth embodiments.

Referring to FIG. 12, a gate insulating layer 130 may be disposed on the active layer ACT1, the source electrode S1, and the drain electrode D1 of the thin film transistor ST1. The gate electrode G1 of the thin film transistor ST1 may be disposed on the gate insulating layer 130. The gate electrode G1 may overlap the active layer ACT1 in the third direction (Z-axis direction).

A first interlayer insulating layer 141 is formed on front surfaces of the gate electrode G1 of the thin film transistor ST1 and the gate insulating layer 130 including the line number identification patterns SG and the first fan-out lines FOL1 . . . that are preset so as not overlap the line number identification patterns SG.

A capacitor electrode CAE may be disposed on the first interlayer insulating layer 141. The capacitor electrode CAE may overlap the gate electrode G1 of the thin film transistor ST1 in the third direction (Z-axis direction). In this case, the second fan-out lines FOL2 . . . that are set so as to not overlap the line number identification patterns SG are formed through the same patterning process as the electrode such as the capacitor electrode CAE. Alternatively, one or more second fan-out lines FOL2 . . . may be formed of the same material as electrodes other than the capacitor electrode CAE, such as the first anode connection electrode ANDE1 or the common electrode, through the same patterning process.

A first anode connection electrode ANDE1 may be disposed on the second interlayer insulating layer 142. The first anode connection electrode ANDE1 may be connected to the drain electrode D1 of the thin film transistor ST1 through a first connection contact hole ANCT1 penetrating through the gate insulating layer 130, the first interlayer insulating layer 141, and the second interlayer insulating layer 142.

Meanwhile, at least one of the second fan-out lines FOL2 . . . may be respectively connected to at least one of the data lines DL in a one-to-one manner respectively through at least one contact hole or the like as needed.

As the first and second fan-out lines FOL are formed and disposed through different patterning processes, the gap between the first and second fan-out lines FOL may be further narrowed in high resolution.

Figure 13:
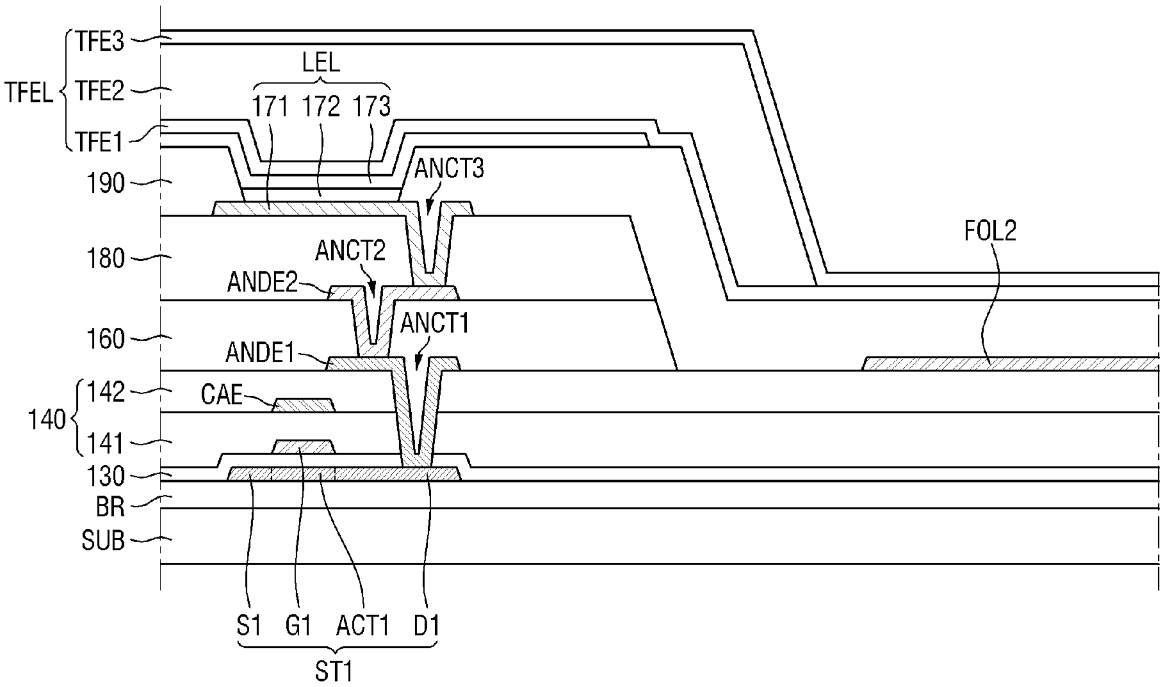
FIG. 13 is another cross-sectional view illustrating the structure of a thin film transistor and a second fan-out line according to any of the second to fourth embodiments.

FIG. 13 is another cross-sectional view illustrating a cross-sectional structure of any one thin film transistor and any one second fan-out line according to the second to fourth embodiments formed on a substrate.

Referring to FIG. 13, a gate electrode G1 of the thin film transistor ST1 may be disposed on the gate insulating layer 130, and the line number identification patterns SG and the first fan-out lines FOL1 . . . may be formed on the barrier layer BR in the non-display area NDA with the same material of the gate electrode G1 through the same patterning process that forms the gate electrode G1.

The gate insulating layer 130 may be formed on the gate electrode G1, the first fan-out lines FOL1 . . . , and the line number identification patterns SG, and the gate electrode G1 may be formed on the gate insulating layer overlying the active layer ACT1 of the thin film transistor ST1. A first interlayer insulating layer 141 may be disposed on the gate insulating layer 130 and the gate electrode G1 of the thin film transistor ST1.

A capacitor electrode CAE may be disposed on the first interlayer insulating layer 141. The capacitor electrode CAE may overlap the gate electrode G1 of the thin film transistor ST1 in the third direction (Z-axis direction). Since the first interlayer insulating layer 141 has a predetermined dielectric constant, a capacitor may be formed by the capacitor electrode CAE, the gate electrode G1, and the first interlayer insulating layer 141 disposed between the capacitor electrode CAE and the gate electrode G1.

A second interlayer insulating layer 142 may be disposed on the capacitor electrode CAE. In addition, a first anode connection electrode ANDE1 may be disposed on the second interlayer insulating layer 142.

The first anode connection electrode ANDE1 may be connected to the drain electrode D1 of the thin film transistor ST1 through a first connection contact hole ANCT1 penetrating through the gate insulating layer 130, the first interlayer insulating layer 141, and the second interlayer insulating layer 142.

When the first anode connection electrode ANDE1 is formed, the second fan-out lines FOL2 . . . may be formed of the same material as the first anode connection electrode ANDE1 through the same patterning process that forms the first anode connection electrode ANDE1.

Meanwhile, a first planarization layer 160 for planarizing a step caused by the thin film transistor ST1 may be disposed on the first anode connection electrode ANDE1. The first planarization layer 160 may be formed as an organic layer made of an acryl resin, an epoxy resin, a phenolic resin, a polyamide resin, a polyimide resin, or the like.

A second anode connection electrode ANDE2 may be disposed on the first planarization layer 160. The second anode connection electrode ANDE2 may be connected to the first anode connection electrode ANDE1 through a second connection contact hole ANCT2 penetrating through the first planarization layer 160. The second anode connection electrode ANDE2 may be formed as a single layer or multiple layers each made of any one of molybdenum (Mo), aluminum (Al), chromium (Cr), gold (Au), titanium (Ti), nickel (Ni), neodymium (Nd), and copper (Cu), or an alloy thereof. Although not illustrated in the drawings, when the second anode connection electrode ANDE2 is formed, the second fan-out lines FOL2 . . . may also be formed of the same material as the second anode connection electrode ANDE2 through the same patterning process that forms the second anode connection electrode ANDE2.

A second planarization layer 180 may be disposed on the second anode connection electrode ANDE2. The second planarization layer 180 may be formed as an organic layer made of an acryl resin, an epoxy resin, a phenolic resin, a polyamide resin, a polyimide resin, or the like.

Light emitting elements LEL and a bank 190 may be on the second planarization layer 180. Each of the light emitting elements LEL includes a pixel electrode 171, a light emitting layer 172, and a common electrode 173.

The pixel electrode 171 may be disposed on the second planarization layer 180. The pixel electrode 171 may be connected to the second anode connection electrode ANDE2 through a third connection contact hole ANCT3 penetrating through the second planarization layer 180.

In a top emission structure that emits light in a direction of the common electrode 173 with respect to the light emitting layer 172, the pixel electrode 171 may be formed of a metal material having high reflectance, such as a stacked structure (Ti/Al/Ti) of aluminum and titanium, a stacked structure (ITO/Al/ITO) of aluminum and indium tin oxide (ITO), an APC alloy, and a stacked structure (ITO/APC/ITO) of an APC alloy and ITO. The APC alloy is an alloy of silver (Ag), palladium (Pd), and copper (Cu).

As illustrated in FIG. 13, when the pixel electrode 171 is formed, the second fan-out lines FOL2 . . . may be formed of the same material as the pixel electrode 171 through the same patterning process that forms the pixel electrode 171.

The bank 190 may be formed to partition or separate regions of the pixel electrode 171 on the second planarization layer 180 to define each light emitting area. The bank 190 may be disposed to cover an edge of the pixel electrode 171. The bank 190 may be formed of an organic layer such as an acrylic resin, an epoxy resin, a phenolic resin, a polyamide resin, or a polyimide resin. Here, each light emitting area refers to an area in which the pixel electrode 171, the light emitting layer 172, and the common electrode 173 are sequentially stacked and holes from the pixel electrode 171 and electrons from the common electrode 173 are combined with each other in the light emitting layer 172 to emit light.

The common electrode 173 may be disposed on the light emitting layer 172. The common electrode 173 may be disposed to cover the light emitting layer 172. The common electrode 173 may be a common layer commonly formed across multiple light emitting areas, e.g., in the first light emitting area, the second light emitting area, and the third light emitting area of a pixel having three sub-pixels. A capping layer may be formed on the common electrode 173.

In the top emission structure, the common electrode 173 may be formed of a transparent conductive material (TCO) such as ITO or indium zinc oxide (IZO) capable of transmitting light, or a semi-transmissive conductive material such as magnesium (Mg), silver (Ag), or an alloy of magnesium (Mg) and silver (Ag). When the common electrode 173 is formed of the semi-transmissive conductive material, light emitting efficiency may be increased by a micro cavity. Although not illustrated in the drawings, when the common electrode 173 is formed, the second fan-out lines FOL2 . . . may also be formed of the same material as the common electrode 173 through the same patterning process that forms the common electrode 173.

An encapsulation layer TFEL may be disposed on the common electrode 173. The encapsulation layer TFEL may include at least one inorganic layer to prevent oxygen or moisture from permeating into the light emitting element LEL. In addition, the encapsulation layer TFEL may include at least one organic layer to protect the light emitting element LEL from foreign materials such as dust. For example, the encapsulation layer TFEL includes a first encapsulation inorganic film TFE1, an encapsulation organic film TFE2, and a second encapsulation inorganic film TFE3.

The first encapsulation inorganic film TFE1 may be disposed on the common electrode 173, the encapsulation organic film TFE2 may be disposed on the first encapsulation inorganic film TFE1, and the second encapsulation inorganic film TFE3 may be disposed on the encapsulation organic film TFE2. The first encapsulation inorganic film TFE1 and the second encapsulation inorganic film TFE3 may be formed as multiple films in which one or more inorganic films of a silicon nitride layer, a silicon oxynitride layer, a silicon oxide layer, a titanium oxide layer, and an aluminum oxide layer may be alternately stacked. The encapsulation organic film TFE2 may be an organic layer such as an acrylic resin, an epoxy resin, a phenolic resin, a polyamide resin, or a polyimide resin.

Thereafter, the touch sensing unit TSU illustrated in FIG. 2 or the like may be disposed on the encapsulation layer TFEL. Although not illustrated in the drawings, when the touch electrodes of the touch sensing unit TSU are formed, the second fan-out lines FOL2 . . . may also be formed of the same material of any one of the touch electrodes of the touch sensing unit TSU through the same patterning process. As described above, the second fan-out lines FOL2 . . . that do not overlap the line number identification patterns SG may be simultaneously formed of the same material as and through the same patterning process that forms any of the source electrode S1 and the drain electrode D1, the capacitor electrode CAE, the first anode connection electrode ANDE1, the second anode connection electrode ANDE2, the pixel electrode 171, the common electrode 173, and any one of the touch electrodes of the touch sensing unit TSU.

Figure 14:
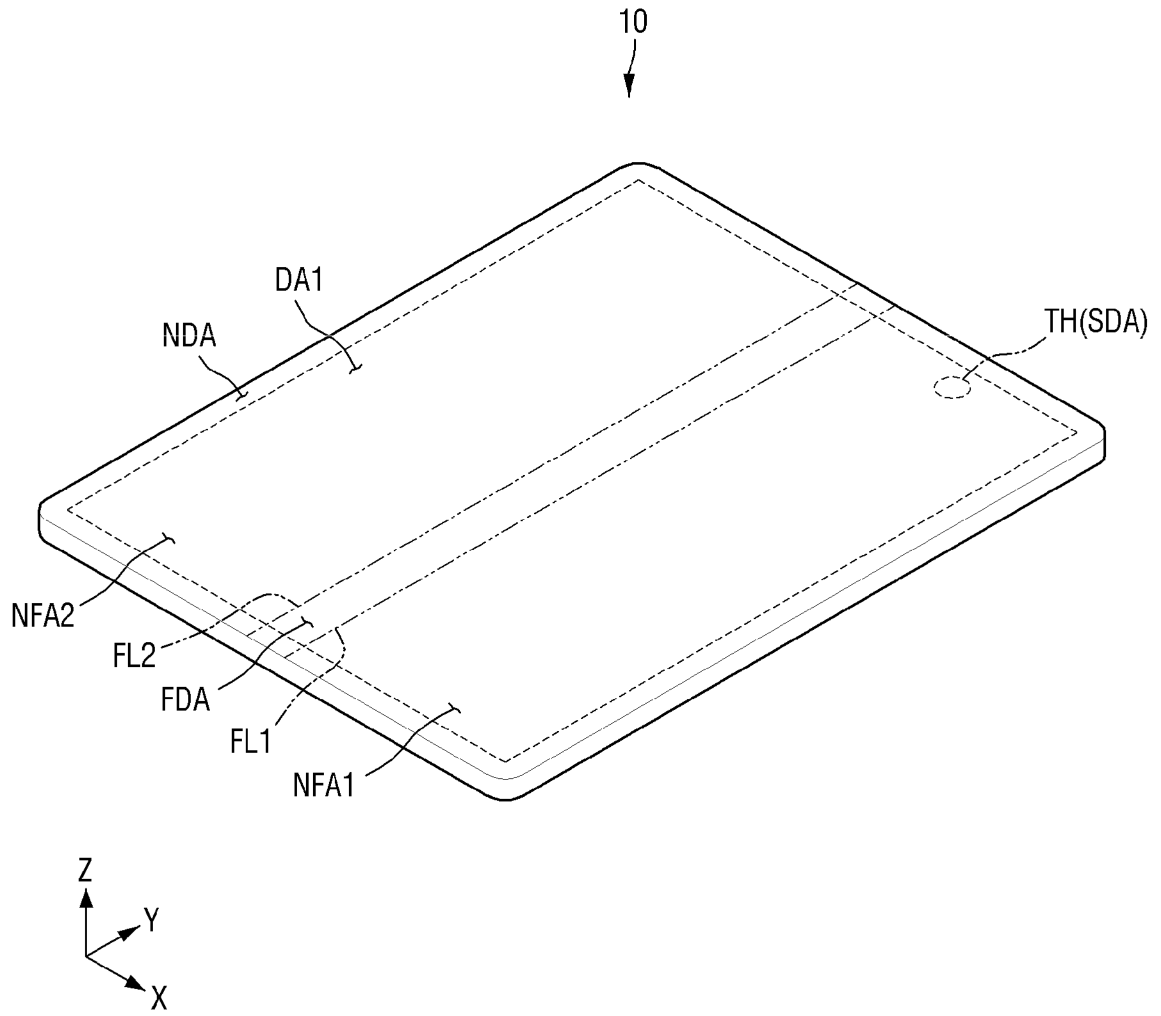
FIGS. 14 and 15 are perspective views illustrating a display device according to another embodiment of the present disclosure.
Figure 15:
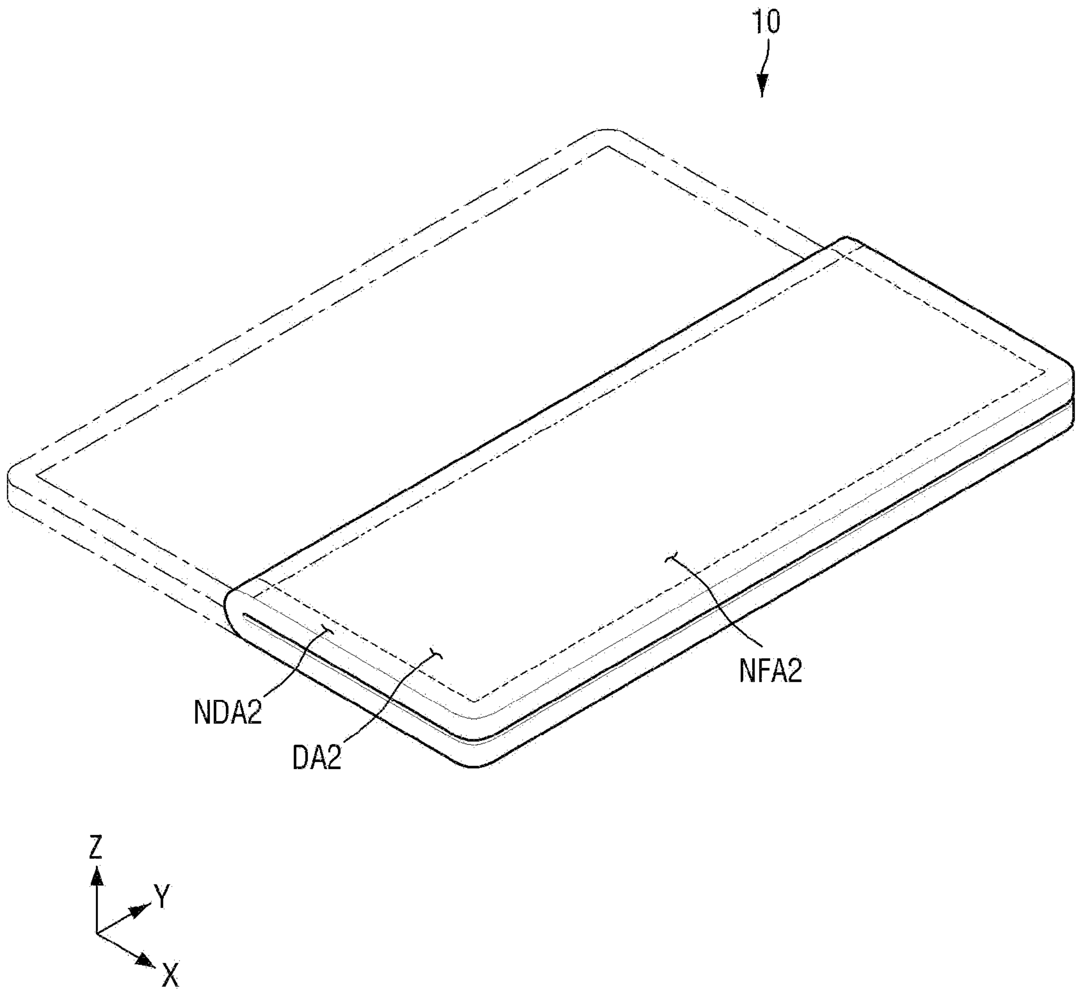

FIGS. 14 and 15 are perspective views illustrating a display device according to another embodiment of the present disclosure.

FIGS. 14 and 15 illustrate that an embodiment of the display device 10 may be a foldable display device that is shown unfolded in FIG. 14 and is shown folded (in the first direction or X-axis direction) in FIG. 15. The display device 10 may repeatedly be folded into a folded state and then unfolded into an unfolded state and may maintain either the folded state or the unfolded state. The display device 10 may be folded in an in-folding manner in which a front surface thereof is disposed on an inner side. When the display device 10 is bent or folded in the in-folding manner, the front surfaces of the display device 10 may be disposed to face each other. Alternatively, the display device 10 may be folded in an out-folding manner in which the front surface thereof is disposed on an outer side. When the display device 10 is bent or folded in the out-folding manner, rear surfaces of the display device 10 may be disposed to face each other.

A first non-folding area NFA1 may be disposed on one side, for example, a right side of a folding area FDA. A second non-folding area NFA2 may be disposed on the other side, for example, a left side of the folding area FDA. The touch sensing unit TSU according to the embodiment of the present specification may be formed and disposed on the first non-folding area NFA1 and the second non-folding area NFA2, respectively.

A first folding line FL1 and a second folding line FL2 may extend in the second direction (Y-axis direction), when the display device 10 may be folded in the first direction (X-axis direction). Accordingly, since a length of the display device 10 in the first direction (X-axis direction) may be reduced by about half, it may be convenient for the user to carry the display device 10.

Meanwhile, the extending direction of the first folding line FL1 and the extending direction of the second folding line FL2 are not limited to the second direction (Y-axis direction). (See also FIGS. 16 and 17, which are described below.) For example, the first folding line FL1 and the second folding line FL2 may extend in the first direction (X-axis direction), and the display device 10 may be folded in the second direction (Y-axis direction). In this case, a length of the display device 10 in the second direction (the Y-axis direction) may be reduced by about half. Alternatively, the first folding line FL1 and the second folding line FL2 may extend in a diagonal direction between the first direction (X-axis direction) and the second direction (Y-axis direction) of the display device 10. In this case, the display device 10 may be folded into a triangular shape.

When the first folding line FL1 and the second folding line FL2 extend in the second direction (Y-axis direction), a length of the folding area FDA in the first direction (X-axis direction) may be shorter than a length thereof in the second direction (Y-axis direction). In addition, a length of the first non-folding area NFA1 in the first direction (X-axis direction) may be longer than the length of the folding area FDA in the first direction (X-axis direction). A length of the second non-folding area NFA2 in the first direction (X-axis direction) may be longer than the length of the folding area FDA in the first direction (X-axis direction).

A first display area DA1 may be disposed on the front surface of the display device 10. The first display area DA1 may overlap or include the folding area FDA, the first non-folding area NFA1, and the second non-folding area NFA2. Therefore, when the display device 10 is unfolded, an image may be displayed in a front direction in the folding area FDA, the first non-folding area NFA1, and the second non-folding area NFA2 of the display device 10.

A second display area DA2 may be disposed on the rear surface of the display device 10 as shown in FIG. 15. The second display area DA2 may overlap the second non-folding area NFA2. Therefore, when the display device 10 is folded, an image may be displayed in the front direction in the second non-folding area NFA2 of the display device 10.

FIGS. 14 and 15 illustrate a through hole TH in which a camera SDA is disposed in the first non-folding area NFA1, but the present disclosure is not limited thereto. The through hole TH or the camera SDA may be disposed in the second non-folding area NFA2 or the folding area FDA or the rear surface of the display device 10.

Figure 16:
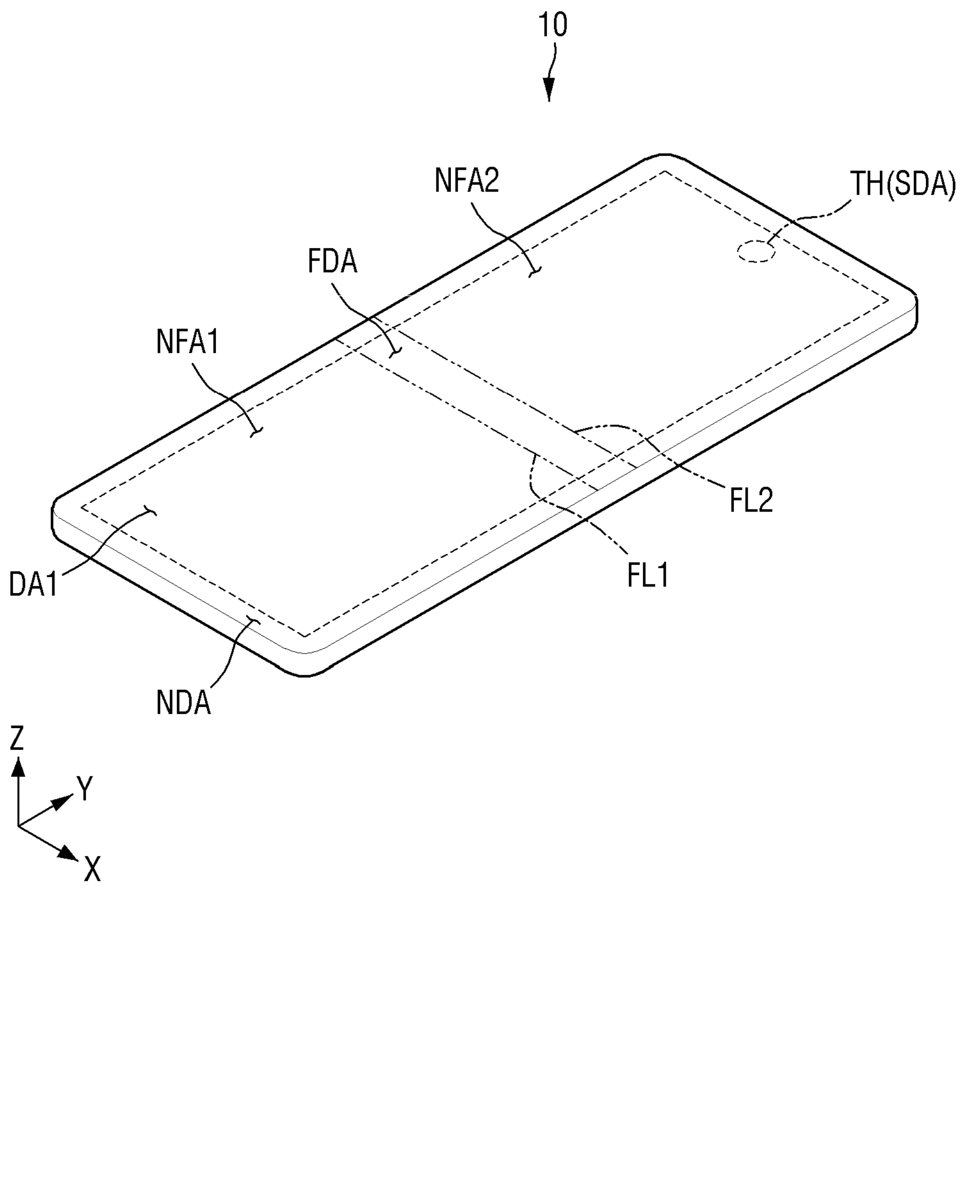
FIGS. 16 and 17 are perspective views illustrating a display device according to still another embodiment of the present disclosure.
Figure 17:
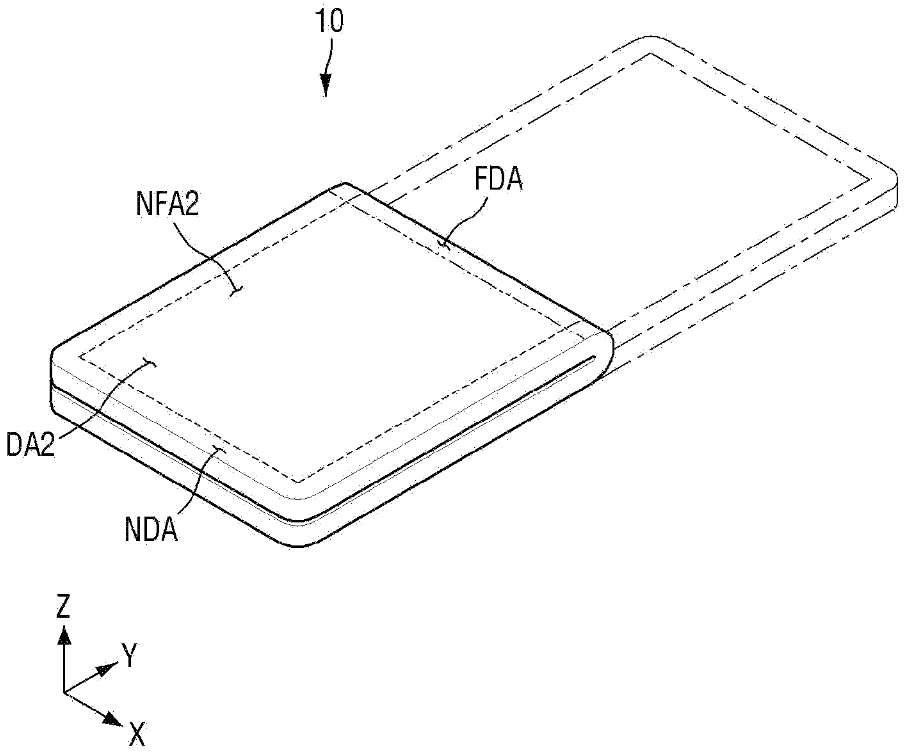

FIGS. 16 and 17 are perspective views illustrating a display device according to still another embodiment of the present disclosure.

FIGS. 16 and 17 illustrate that the display device 10 is a foldable display device that is folded in the second direction (Y-axis direction). The display device 10 has a folded state such as shown in FIG. 17 and an unfolded state such as shown in FIG. 16, and the display device 10 may maintain either the folded state or the unfolded state at different times. The display device 10 may be folded in an in-folding manner in which a front surface thereof is disposed on an inner side. When the display device 10 is bent or folded in the in-folding manner, the front surfaces of the display device 10 may be disposed to face each other. Alternatively, the display device 10 may be folded in an out-folding manner in which the front surface thereof is disposed on an outer side. When the display device 10 is bent or folded in the out-folding manner, rear surfaces of the display device 10 may be disposed to face each other.

The display device 10 may include a folding area FDA, a first non-folding area NFA1, and a second non-folding area NFA2. The folding area FDA may be an area in which the display device 10 can bend or fold, and the first non-folding area NFA1 and the second non-folding area NFA2 may be areas in which the display device 10 is not folded. The first non-folding area NFA1 may be disposed on one side, for example, a right side of the folding area FDA. The second non-folding area NFA2 may be disposed on the other side, for example, a left side of the folding area FDA.

The touch sensing unit TSU according to the embodiment of the present specification may be formed and disposed on the first non-folding area NFA1 and the second non-folding area NFA2.

On the other hand, the folding area FDA may be an area bent with a predetermined curvature extending between the first folding line FL1 and the second folding line FL2. Therefore, the first folding line FL1 may be a boundary between the folding area FDA and the first non-folding area NFA1, and the second folding line FL2 may be a boundary between the folding area FDA and the second non-folding area NFA2.

As illustrated in FIGS. 16 and 17, the first folding line FL1 and the second folding line FL2 may extend in the first direction (X-axis direction), and the display device 10 may be folded in the second direction (Y-axis direction). Accordingly, since a length of the display device 10 in the second direction (Y-axis direction) may be reduced by about half, it may be convenient for a user to carry the display device 10.

Meanwhile, the extending direction of the first folding line FL1 and the extending direction of the second folding line FL2 are not limited to the first direction (X-axis direction). For example, the first folding line FL1 and the second folding line FL2 may extend in the second direction (Y-axis direction), and the display device 10 may be folded in the first direction (X-axis direction). In this case, a length of the display device 10 in the first direction (the X-axis direction) may be reduced by about half. Alternatively, the first folding line FL1 and the second folding line FL2 may extend in a diagonal direction between the first direction (X-axis direction) and the second direction (Y-axis direction) of the display device 10. In this case, the display device 10 may be folded into a triangular shape.

When the first folding line FL1 and the second folding line FL2 extend in the first direction (X-axis direction) as illustrated in FIGS. 16 and 17, a length of the folding area FDA in the second direction (Y-axis direction) may be shorter than a length thereof in the first direction (X-axis direction). In addition, a length of the first non-folding area NFA1 in the second direction (Y-axis direction) may be longer than the length of the folding area FDA in the second direction (Y-axis direction). In addition, a length of the second non-folding area NFA2 in the second direction (Y-axis direction) may be longer than the length of the folding area FDA in the second direction (Y-axis direction).

A first display area DA1 may be disposed on the front surface of the display device 10. The first display area DA1 may overlap or include the folding area FDA, the first non-folding area NFA1, and the second non-folding area NFA2. Therefore, when the display device 10 is unfolded, an image may be displayed in a front direction in the folding area FDA, the first non-folding area NFA1, and the second non-folding area NFA2 of the display device 10.

A second display area DA2 may be disposed on the rear surface of the display device 10. The second display area DA2 may overlap the second non-folding area NFA2. Therefore, when the display device 10 is folded with the display area DA1 inside, an image may be displayed in the front direction in the second non-folding area NFA2 of the display device 10.

FIGS. 16 and 17 illustrate that a through hole TH in which a camera SDA is disposed may be in the second non-folding area NFA2, but the present disclosure is not limited thereto. The through hole TH may be disposed, for example, in the first non-folding area NFA1 or the folding area FDA.

In concluding the detailed description, those skilled in the art will appreciate that many variations and modifications can be made to the preferred embodiments without substantially departing from the principles of the present disclosure. Therefore, the disclosed preferred embodiments of the disclosure are used in a generic and descriptive sense only and not for purposes of limitation.

What is claimed is:

1. A display device comprising:

gate lines, data lines, and power lines electrically connected to sub-pixels in a display area of a display panel, each of the gate lines, the data lines and the power lines being disposed in the display area, and the power lines extending in a direction parallel to the data lines in the display area;

fan-out lines in a non-display area of the display panel and electrically connected to the data lines;

gate control lines electrically connected to a gate drive unit disposed in the non-display area; and line number identification patterns in a line arrangement area through which one or more lines of the gate lines, the data lines, the fan-out lines, the gate control lines, and the power lines extend, the line number identification patterns being in a floating state, wherein the line arrangement area and the gate drive unit, which is connected to the gate lines extending in a first direction, are disposed in the non-display area, wherein the one or more lines includes first lines, each of which is disposed between the line number identification patterns, and second lines, each of which overlaps a portion of each of the line number identification patterns in a thickness direction of the display device perpendicular to a substrate, wherein the first lines and the line number identification patterns are disposed on a same layer and include a same material, and the second lines are disposed on a different layer than the first lines and the line number identification patterns in the thickness direction perpendicular to the substrate, and wherein each of the first lines extends from a first side of the line arrangement area to a second side of the line arrangement area, which is an opposite side to the first side in a second direction perpendicular to the first direction, and the line number identification patterns are disposed between the first side and the second side of the line arrangement area in the second direction.

2. The display device of claim 1, wherein the line number identification patterns are disposed side by side at a preset interval in the line arrangement area, the first lines of the one or more lines do not overlap the line number identification patterns, and at least one insulating layer is interposed between the line number identification patterns and the second lines.

3. The display device of claim 2, wherein the line number identification patterns and the first lines are portions of a first patterned layer in the display panel, the line number identification patterns are adjacent to the first lines or in areas between the first lines and are not electrically connected to the first lines, and the second lines are portions of a second patterned layer of the display panel and overlap the line number identification patterns with the at least one insulating layer interposed between the second lines and the line number identification patterns.

4. The display device of claim 3, wherein at least one of a size of the line number identification patterns and a formation width of the line number identification patterns is smaller than a sum of a distance between two lines adjacent to each other among the one or more lines and widths of the two lines.

5. The display device of claim 2, wherein the one or more lines includes odd-numbered lines and even-numbered lines, the first lines are the odd-numbered lines and are formed and disposed in the line arrangement area with the same material as the line number identification patterns through a same patterning process, the line number identification patterns are respectively adjacent to the odd-numbered lines, and the second lines are the even-numbered lines and respectively overlap the line number identification patterns with the at least one insulating layer interposed between the second lines and the line number identification patterns.

6. The display device of claim 5, wherein the odd-numbered lines and the even-numbered lines are connected through respective contact holes to the data lines or the power lines in a one-to-one manner.

7. The display device of claim 2, wherein the first lines and the line number identification patterns are formed of a same material as a gate electrode of a thin film transistor through a same patterning process that forms the gate electrode, or are formed of a same material as source and drain electrodes of the thin film transistor through a same patterning process that forms the source and drain electrodes, and the second lines are simultaneously formed of a same material of an electrode selected from a group consisting of the source and drain electrodes, and a capacitor electrode, a first anode connection electrode, a second anode connection electrode, a pixel electrode, a common electrode, and any one of touch electrodes of a touch sensing unit.

8. A display device comprising:

gate lines, data lines, and power lines electrically connected to sub-pixels formed in a display area of a display panel, each of the gate lines, the data lines and the power lines being disposed in the display area, and the power lines extending in a direction parallel to the data lines in the display area;

fan-out lines formed in a non-display area of the display panel and electrically connected to the data lines;

gate control lines electrically connected to a gate drive unit disposed in the non-display area;

first lines and second lines in a line arrangement area, the first lines and the second lines being selected from a group consisting of the gate lines, the data lines, the power lines, the fan-out lines, and the gate control lines; and line number identification patterns disposed in the line arrangement area and in a floating state electrically separated from the first lines and the second lines, wherein the line arrangement area and the gate drive unit, which is connected to the gate lines extending in a first direction, are disposed in the non-display area, wherein each of the first lines is disposed between the line number identification patterns, and each of the second lines overlaps a portion of each of the line number identification patterns in a thickness direction of the display device perpendicular to a substrate, wherein the first lines and the line number identification patterns are disposed on a same layer and include a same material, and the second lines are disposed on a different layer than the first lines and the line number identification patterns in the thickness direction perpendicular to the substrate, and wherein each of the first lines extends from a first side of the line arrangement area to a second side of the line arrangement area, which is an opposite side to the first side in a second direction perpendicular to the first direction, and the line number identification patterns are disposed between the first side and the second side of the line arrangement area in the second direction.

9. The display device of claim 8, wherein the line number identification patterns are respectively adjacent to the first lines and positioned so as not to be electrically connected to the first lines or are each disposed in an area between lines disposed to be adjacent to each other among the one or more lines.

10. The display device of claim 8, wherein the first lines are formed simultaneously with the line number identification patterns through a same patterning process that forms the line number identification patterns, and at least one insulating layer is interposed between the line number identification patterns and the second lines.

11. The display device of claim 10, wherein the first lines are odd-numbered lines, and the second lines are even-numbered lines.

12. The display device of claim 10, wherein each of the first lines has a straight-line shape in the line arrangement area, at least one of the line number identification patterns is in an area between the first lines that are adjacent to each other among the first lines, and the second lines are disposed on a different layer from the line number identification patterns with the at least one insulating layer interposed between the line identification patterns and the second lines and are bent at least once so as not to overlap the line number identification patterns, the second lines having a longer length than the first lines.

13. The display device of claim 12, wherein each of the second lines include at least one bent portion bent in a shape surrounding at least one side of the line number identification patterns, the second lines and the line number identification patterns being disposed on different layers with the at least one insulating layer interposed between the line identification patterns and the second lines, and the at least one bent portion is formed in at least one of a "C" shape, an inverted "C" shape, an "S" shape, an inverted "S" shape, a "ㄷ" shape, an inverted "ㄷ" shape, a "ㄹ" shape, and an inverted "ㄹ" shape, or a combination thereof in plan view.

14. The display device of claim 10, wherein at least one of the line number identification patterns is in an area between a pair of the first and second lines that are adjacent to each other, the first lines are bent at least once so as not to be electrically connected to the line number identification patterns disposed on the same layer, and the second lines are bent at least once so as not to overlap the line number identification pattern on a different layer from the line number identification patterns.

15. The display device of claim 14, wherein the first lines include at least one first bent portion bent in a shape surrounding at least one side surface of the line number identification patterns disposed on the same layer, the second lines include at least one second bent portion bent in a shape surrounding at least one side surface of the line number identification patterns formed and disposed on the different layer with the at least one insulating layer interposed between the line identification patterns and the second lines, and the at least one first and second bent portions are formed in at least one of a "C" shape, an inverted "C" shape, an "S" shape, an inverted "S" shape, a "ㄷ" shape, an inverted "ㄷ" shape, a "ㄹ" shape, and an inverted "ㄹ" shape, or a combination thereof in plan view.

16. The display device of claim 10, wherein at least one line of the first lines and the second lines is connected to a corresponding one of the data lines or the power lines in a one-to-one manner through at least one contact hole.

17. The display device of claim 10, wherein the first lines and the line number identification patterns are formed of the same material as a portion of a thin film transistor and formed through the same patterning process that forms the portion of the thing film transistor in the display panel, the portion of the thin film transistor being one of a gate electrode and the source and drain electrodes of the thin film transistor, and the second lines are simultaneously formed of the same material and through the same process as one of a capacitor electrode, a first anode connection electrode, a second anode connection electrode, a pixel electrode, a common electrode, and any one of touch electrodes of a touch sensing unit of the display device.

18. An electronic device comprising:

a display device; and a main processor controlling an operation of the display device, wherein the display device comprises:

gate lines, data lines, and power lines electrically connected to sub-pixels in a display area of a display panel, each of the gate lines, the data lines and the power lines being disposed in the display area, and the power lines extending in a direction parallel to the data lines in the display area;

fan-out lines in a non-display area of the display panel and electrically connected to the data lines;

gate control lines electrically connected to a gate drive unit disposed in the non-display area; and line number identification patterns in a line arrangement area through which one or more lines of the gate lines, the data lines, the fan-out lines, the gate control lines, and the power lines extend, the line number identification patterns being in a floating state, wherein the line arrangement area and the gate drive unit, which is connected to the gate lines extending in a first direction, are disposed in the non-display area, wherein the one or more lines includes first lines, each of which is disposed between the line number identification patterns, and second lines, each of which overlaps a portion of each of the line number identification patterns in a thickness direction of the display device perpendicular to a substrate, wherein the first lines and the line number identification patterns are disposed on a same layer and include a same material, and the second lines are disposed on a different layer than the first lines and the line number identification patterns in the thickness direction perpendicular to the substrate, and wherein each of the first lines extends from a first side of the line arrangement area to a second side of the line arrangement area, which is an opposite side to the first side in a second direction perpendicular to the first direction, and the line number identification patterns are disposed between the first side and the second side of the line arrangement area in the second direction.

* * * * *